(12) United States Patent
Edinger et al.

(10) Patent No.: US 9,631,700 B2
(45) Date of Patent: *Apr. 25, 2017

(54) MULTI-FUNCTION APPLIANCE KNOB INCORPORATING MULTIPLE ROTATION MODULATING MECHANISMS

(71) Applicant: Whirlpool Corporation, Benton Harbor, MI (US)

(72) Inventors: Benjamin Edinger, St. Joseph, MI (US); Casey L. McCuan, Saugatuck, MI (US); Leif A. Norland, St. Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 27 days.

This patent is subject to a terminal disclaimer.

(21) Appl. No.: 14/710,975

(22) Filed: May 13, 2015

(65) Prior Publication Data

US 2016/0333990 A1 Nov. 17, 2016

(51) Int. Cl.
| | | |
|---|---|---|
| *G05G 1/015* | (2008.04) | |
| *F16H 1/28* | (2006.01) | |
| *F16H 19/00* | (2006.01) | |
| *F24C 3/12* | (2006.01) | |
| *F24C 7/08* | (2006.01) | |

(52) U.S. Cl.
CPC .............. *F16H 1/28* (2013.01); *F16H 19/001* (2013.01); *F24C 3/124* (2013.01); *F24C 7/08* (2013.01); *G05G 1/015* (2013.01)

(58) Field of Classification Search
CPC .................................................... F16H 19/001
See application file for complete search history.

(56) References Cited

U.S. PATENT DOCUMENTS

| | | | |
|---|---|---|---|
| 1,534,356 A | 4/1925 | Burke | |
| 1,744,330 A | 1/1930 | Mull | |
| 1,793,051 A | 2/1931 | Butler | |
| 2,103,517 A | 12/1937 | De Tar | |
| 2,305,489 A | 12/1942 | Payne | |
| 2,526,445 A | 10/1950 | Young | |
| 2,608,082 A * | 8/1952 | Jones .................... | D06F 33/02 200/19.13 |
| 2,803,966 A | 8/1957 | Morris | |
| 2,914,953 A | 12/1959 | Tyzack | |
| 3,090,249 A | 5/1963 | Martin | |
| 3,166,242 A | 1/1965 | Shomaker | |

(Continued)

*Primary Examiner* — Erin D Bishop
*Assistant Examiner* — Lori Wu

(57) ABSTRACT

A control knob for an appliance includes an outer control ring, a stationary hub, a rotation modulating mechanism coupled to the outer control ring and engaged with an outer surface of the stationary hub, wherein the outer control ring is rotationally operable about the stationary hub at a first rate, an indicial ring positioned around the stationary hub, wherein the indicial ring engages a portion of the rotation modulating mechanism, wherein rotation of the outer control ring at the first rate causes the rotation modulating mechanism to rotate the indicial ring about the stationary hub at a second rate, the second rate being different than the first rate and an encoder shaft positioned within the stationary hub, wherein an inner gearing mechanism extends between an exterior surface of the encoder shaft and one of the outer control ring and the indicial ring.

20 Claims, 21 Drawing Sheets

(56) References Cited

U.S. PATENT DOCUMENTS

| | | | |
|---|---|---|---|
| 3,292,440 A | 12/1966 | Karr et al. | |
| 3,610,753 A | 10/1971 | Neubauer | |
| 3,724,281 A | 4/1973 | Dorchester | |
| 4,140,048 A | 2/1979 | Grove et al. | |
| 5,127,286 A | 7/1992 | Wittig | |
| 5,831,230 A * | 11/1998 | Cole | H01H 43/102 200/35 R |
| 6,196,943 B1 | 3/2001 | Chen | |
| 6,710,565 B2 | 3/2004 | Maeda | |
| 7,044,023 B2 | 5/2006 | Toniolo et al. | |
| 8,192,319 B2 | 6/2012 | Rheme et al. | |
| 8,866,643 B2 | 10/2014 | Sano | |
| 2009/0084220 A1* | 4/2009 | Morizono | B60H 1/0065 74/501.6 |
| 2010/0000417 A1 | 1/2010 | Tetreault et al. | |
| 2012/0056761 A1* | 3/2012 | Sano | G05G 1/08 341/35 |
| 2012/0241654 A1 | 9/2012 | Clifford | |

\* cited by examiner

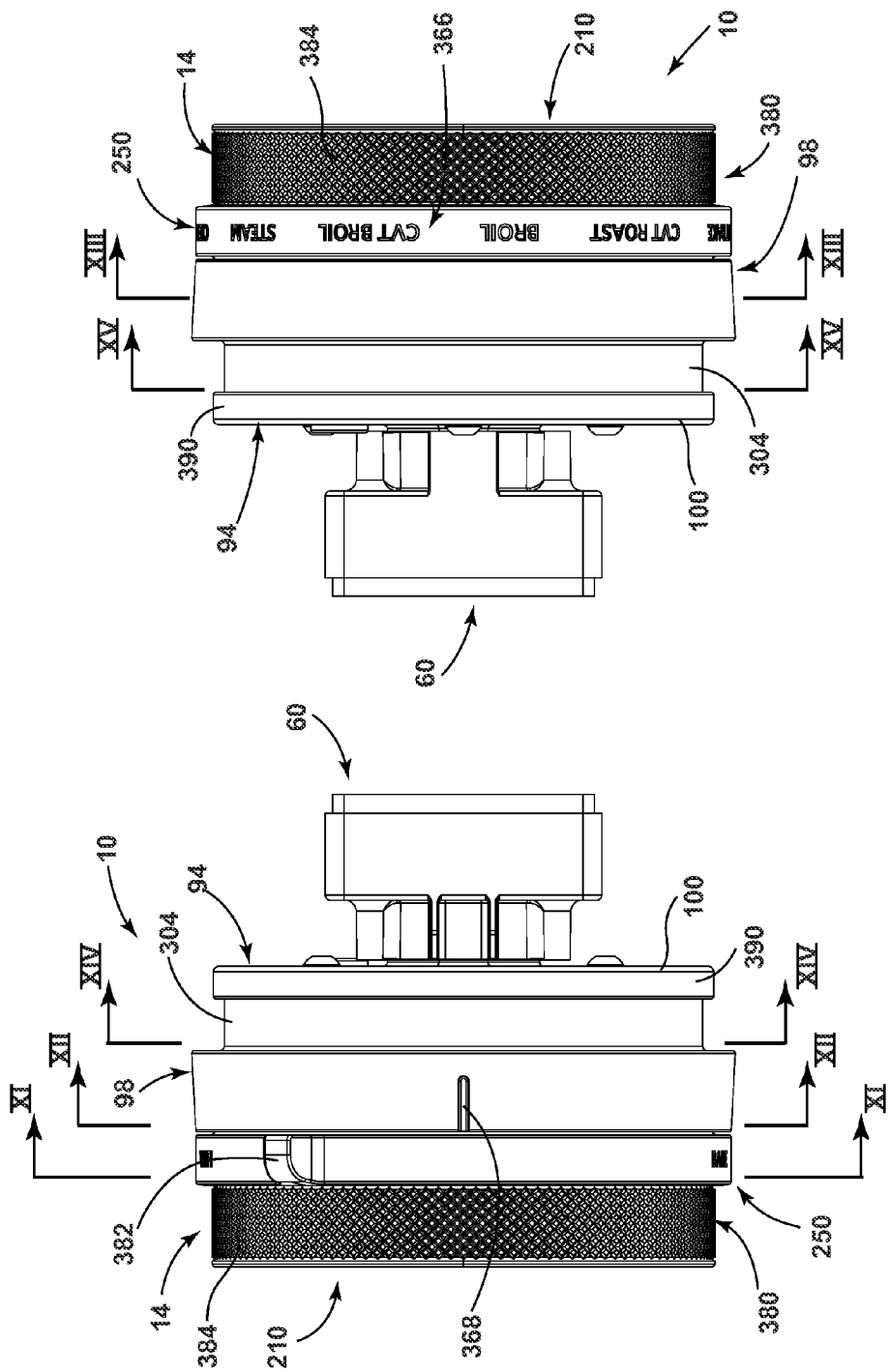

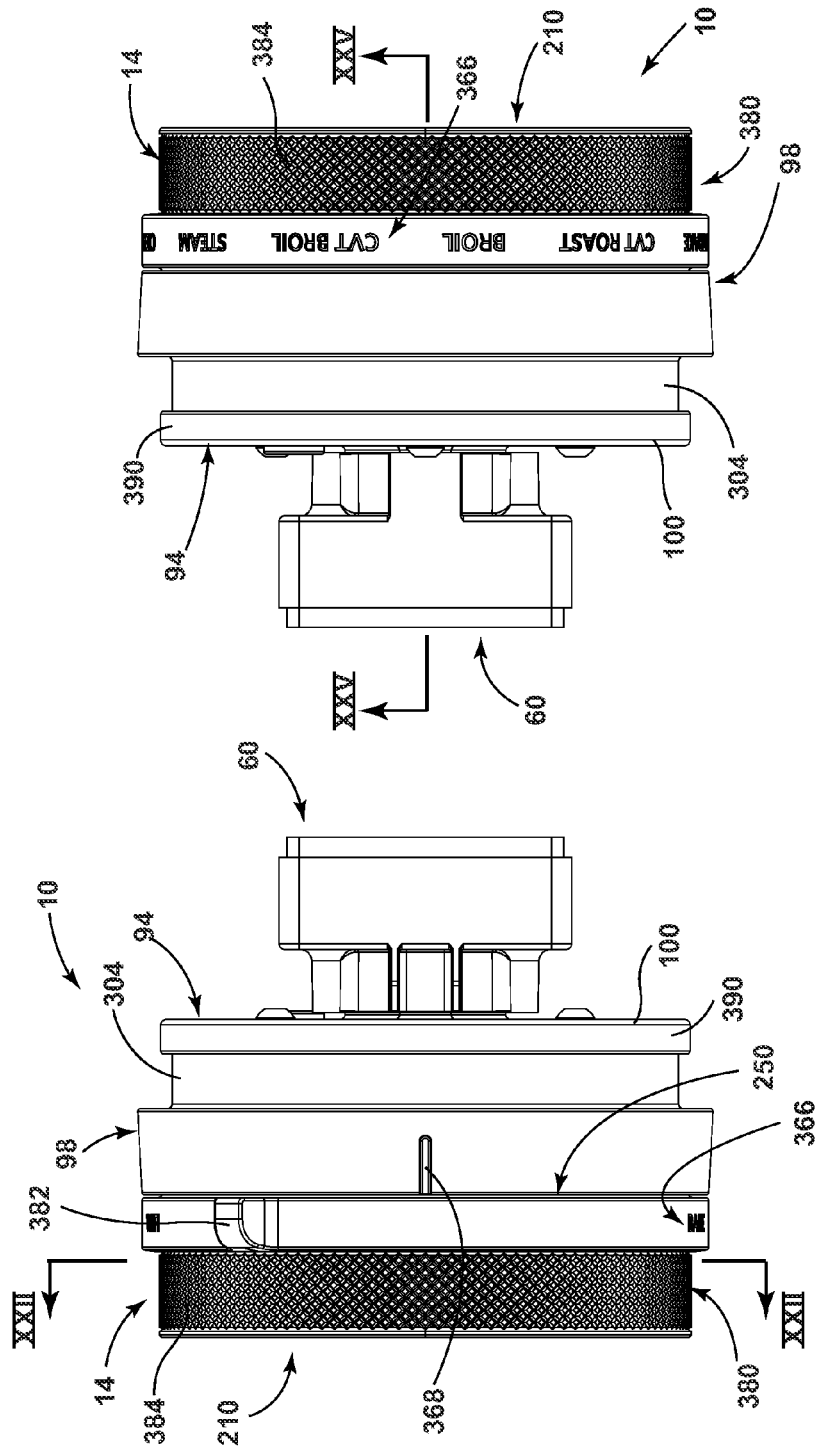

MULTI-FUNCTION APPLIANCE KNOB INCORPORATING MULTIPLE ROTATION MODULATING MECHANISMS

BACKGROUND

The present device generally relates to control knobs for operating the functions of an appliance, specifically, a multi-function appliance knob that modulates a rotational input into multiple separately modulated rotational outputs.

SUMMARY

In at least one aspect, a control knob for an appliance includes an outer control ring, a stationary hub and a rotation modulating mechanism coupled to the outer control ring and engaged with an outer surface of the stationary hub. The outer control ring is rotationally operable about the stationary hub at a first rate. An indicial ring is positioned around the stationary hub, wherein the indicial ring engages a portion of the rotation modulating mechanism. Rotation of the outer control ring at the first rate causes the rotation modulating mechanism to rotate the indicial ring about the stationary hub at a second rate, the second rate being different than the first rate. An encoder shaft is positioned within the stationary hub, wherein an inner gearing mechanism extends between an exterior surface of the encoder shaft and one of the outer control ring and the indicial ring.

In at least another aspect, a control knob for an appliance includes an outer rotation modulating mechanism having an external portion and an internal portion. Rotation of the external portion a first angular distance causes the internal portion to rotate a second angular distance, the first angular distance being different than the second angular distance. An internal rotational mechanism has an encoder shaft and a transfer mechanism, wherein the encoder shaft is rotationally connected to an appliance control and the transfer mechanism. The transfer mechanism engages the internal portion of the outer rotation modulating mechanism to place a portion of the outer rotation modulating mechanism in communication with the appliance control. A rotation of the external portion in a first direction causes a rotation of the encoder shaft in a second direction that is opposite the first direction.

In at least another aspect, an appliance control knob includes a stationary hub extending from a support substrate, the stationary hub having an outer surface that defines a hub flange, wherein an appliance control is in communication with an interior volume of the stationary hub. A rotation modulating mechanism is in rotational engagement with the outer surface of the stationary hub. An indicial ring is positioned about the stationary hub and in rotational engagement with the rotation modulating mechanism. Rotation of the rotation modulating mechanism about the stationary hub at a first rate causes the indicial ring to rotate about the stationary hub at a second rate, the first rate being different than the second rate. An encoder shaft is disposed within the interior volume of the stationary hub and a transfer mechanism that extends between the encoder shaft and the rotation modulating mechanism, wherein the encoder shaft and the transfer mechanism place the appliance control in communication with the rotation modulating mechanism. The hub flange positions the indicial ring at a predetermined distance from the support substrate.

These and other features, advantages, and objects of the present device will be further understood and appreciated by those skilled in the art upon studying the following specification, claims, and appended drawings.

BRIEF DESCRIPTION OF THE DRAWINGS

In the drawings:

FIG. 7 is a top plan view of the multi-function appliance knob of FIG. 2;

FIG. 8 is a bottom plan view of the multi-function appliance knob of FIG. 2;

FIG. 20 is a top plan view of the multi-function appliance knob of FIG. 18;

FIG. 21 is a bottom plan view of the multi-function appliance knob of FIG. 18;

DETAILED DESCRIPTION OF EMBODIMENTS

Figure 1:
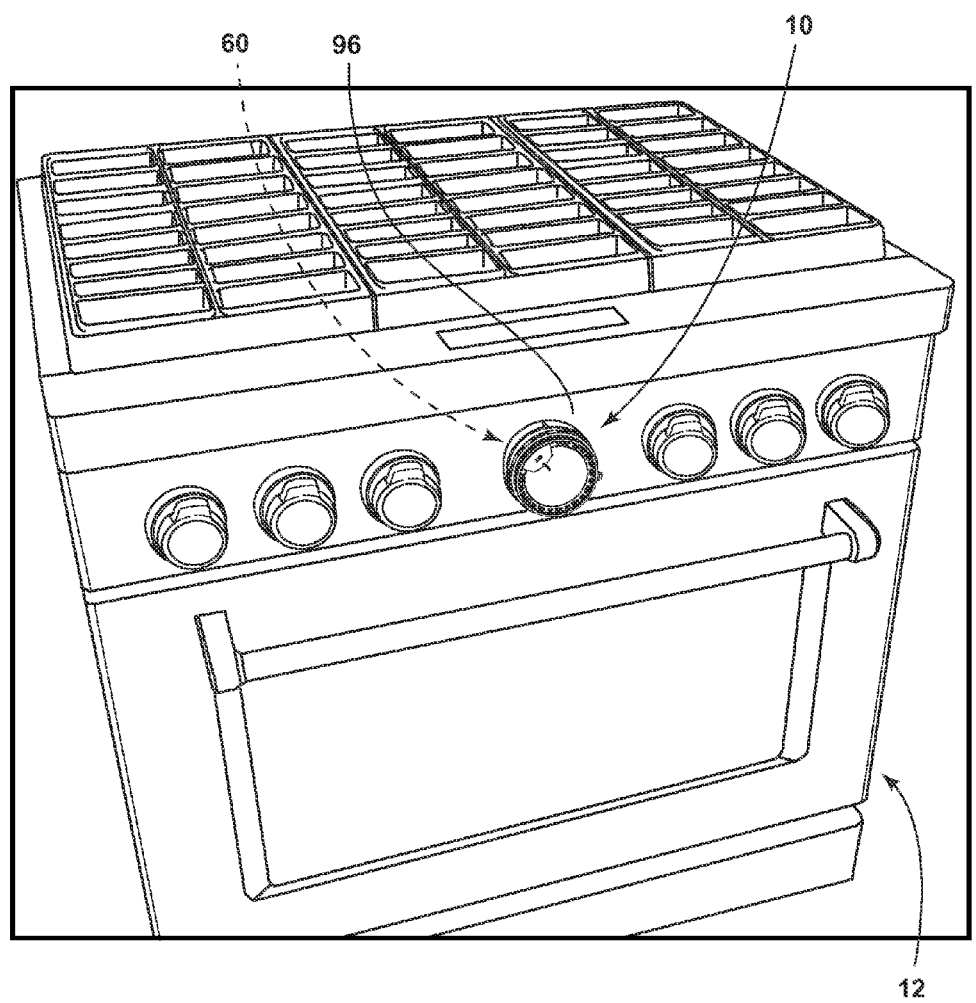
FIG. 1 is a top perspective view of an appliance incorporating one embodiment of the multi-function appliance knob.

For purposes of description herein the terms "upper," "lower," "right," "left," "rear," "front," "vertical," "horizontal," and derivatives thereof shall relate to the device as oriented in FIG. 1. However, it is to be understood that the device may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As illustrated in FIGS. 1-11, reference numeral 10 generally refers to a multi-function appliance control knob used to control various functions of an appliance 12, such as a cooking appliance. According to the various embodiments, the control knob 10 can include an outer control ring 14 and a stationary hub 16. A rotation modulating mechanism 18 is coupled to the outer control ring 14 and is engaged with an outer surface 20 of the stationary hub 16. The outer control ring 14 is rotationally operable about the stationary hub 16 at a first rate of rotation 22. An indicial ring 24 is positioned around the stationary hub 16, wherein the indicial ring 24 engages a portion of the rotation modulating mechanism 18. Rotation of the outer control ring 14 at the first rate of rotation 22 causes the rotation modulating mechanism 18 to rotate the indicial ring 24 about the stationary hub 16 at a second rate of rotation 26. According to the various embodiments, the second rate of rotation 26 is different than the first rate of rotation 22. An encoder shaft 28 is positioned within the stationary hub 16, wherein an inner gearing mechanism 30 extends between an exterior surface 32 of the encoder shaft 28 and either the outer control ring 14 or the indicial ring 24. According to the various embodiments, when the inner gearing mechanism 30 extends between the encoder shaft 28 and the outer control ring 14, the first rate of rotation 22 is slower than the second rate of rotation 26. Alternatively, when the inner gearing mechanism 30 extends between the encoder shaft 28 and the indicial ring 24, the first rate of rotation 22 is faster than the second rate of rotation 26.

Referring now to FIGS. 9-17, the inner gearing mechanism 30 of the control knob 10 can extend between the encoder shaft 28 and the outer control ring 14. In this embodiment, the rotation modulating mechanism 18 includes planetary gears 40 that rotationally engage outward cogs in the form of a sun gear 42 defined within the outer surface 20 of the stationary hub 16. The planetary gears 40 can also engage inward cogs in the form of an accelerating gear 44 defined within an inner surface 46 of the indicial ring 24. The outer control ring 14 can include planetary seats 48 that hold the planetary gears 40 in a fixed axial position relative to the outer control ring 14. This configuration allows the planetary gears 40 to rotate within the planetary seats 48 of the outer control ring 14 such that the planetary gears 40 revolve about the stationary hub 16 at the same rotational rate as the outer control ring 14. As the planetary gears 40 engage and revolve around the sun gear 42, which can be a central and/or stationary sun gear 42, within the outer surface 20 of the stationary hub 16, the planetary gears 40 rotate at a third rate of rotation 50 within the planetary seats 48. This third rate of rotation 50 is transferred to the indicial ring 24, thereby causing the indicial ring 24 to rotate about the stationary hub 16 at the second rate of rotation 26 which, according to such an embodiment, is faster than the first rate of rotation 22.

It is contemplated that the resulting rotational configurations of the various aspects of the control knob 10 is that the outer control ring 14 is rotated by the user, and the indicial ring 24, as a result of the rotation modulating mechanism 18, rotates faster than the outer control ring 14. Accordingly, the user's rotation of the outer control ring 14 results in an accelerated rotation of the indicial ring 24. The result of this configuration is that the minor movements of the outer control ring 14 causes proportionally greater rotational movement of the indicial ring 24 such that adjusting portions of an appliance control 60 of the appliance 12 requires minimal rotational input to achieve a more significant and accelerated rotational output.

According to the various embodiments, the gearing ratios between the indicial ring 24 and the outer control ring 14 that are created as a result of the rotation modulating mechanism 18 can include the various ratios that can be within the range of from approximately 1.1:1.0 to approximately 2.0:1.0. The exact ratio of indicial ring 24 rotations to outer control ring 14 rotations can be varied depending upon any one of various factors that can include, but are not limited to, design considerations, the size of the control knob 10, the degree of minute or large adjustment needed to operate the appliance 12, aesthetics, user experience, and other various factors.

Referring again to FIGS. 9-17, according to various embodiments, the outer control ring 14 can extend from at least the planetary gears 40 to the inner gearing mechanism 30. In such an embodiment, the stationary hub 16 can include a perimetrical wall 70 that defines an interior volume 72 of the stationary hub 16. The inner gearing mechanism 30 can be disposed at least partially within this interior volume 72 of the stationary hub 16, wherein the inner gearing mechanism 30 extends at least partially through a portion of the stationary hub 16, such as through an aperture 74 defined within the perimetrical wall 70. In this manner, the inner gearing mechanism 30 can engage both the exterior surface 32 of the encoder shaft 28, and the interior surface 76 of the outer control ring 14 without interference from the perimetrical wall 70.

It is contemplated that the inner gearing mechanism 30 can be axially secured within gearing seats 90 defined within a hub flange 92 of the stationary hub 16 and also within a support substrate 94 of the control knob 10. It is contemplated that the support substrate 94 can be any one of various members that can include, but are not limited to, an exterior wall 96 of the appliance 12, a knob base 98, a base plate 100 of the control knob 10, a function dividing wall 102 of the control knob 10, or other similar supporting member. The result is that the inner gearing mechanism 30 is secured within its rotational axis and at a fixed position relative to the stationary hub 16 to allow the inner gearing mechanism 30 to rotate, but to substantially prevent wobble or other non-rotational movement of the inner gearing mechanism 30 during operation of the control knob 10.

Referring again to FIGS. 9-17, the inner gearing mechanism 30 can include a cluster-type gear having first and second gear portions 110, 112. The first and second gear portions 110, 112 can be disposed upon an inner gear axle 114 that extends from the knob base 98 disposed at the back of the control knob 10 to a portion of the stationary hub 16, such as the hub flange 92, to substantially fix the position of the inner gearing mechanism 30 within a portion of the interior volume 72 of the stationary hub 16. It is contemplated that the first gear portion 110 of the inner gearing mechanism 30 is configured to engage the outer control ring 14. In this manner, as the outer control ring 14 is rotated, the rotation of the outer control ring 14 is transferred from an inner transfer gear 120 defined within the interior surface 76 of the outer control ring 14 to the first gear portion 110 of the inner gearing mechanism 30. The second gear portion 112 of the inner gearing mechanism 30 engages the encoder shaft 28 to transfer the rotation of the outer control ring 14 to the encoder shaft 28. Based upon the configuration of the first and second gear portions 110, 112 of the inner gearing mechanism 30, rotation of the outer control ring 14 in a first rotational direction 122 results in the encoder shaft 28 rotating in a second rotational direction 124 that is opposite the first rotational direction 122. Accordingly, when the outer control ring 14 is rotated in a clockwise direction, the encoder shaft 28 is rotated in a counterclockwise direction. In order to receive the rotation of the inner gearing mechanism 30 from the second gear portion 112, the encoder shaft 28 can include a first encoder gear 126 that can include cogs that mesh with the second gear portion 112 of the inner gearing mechanism 30.

Referring again to FIGS. 9-17, in addition to reversing the direction of rotation of the encoder shaft 28 with respect to the outer control ring 14, the first and second gear portions 110, 112 of the inner gearing mechanism 30 can define an inner reduction mechanism 140. In this manner, the first gear portion 110 can include a first diameter 142 and the second gear portion 112 can have a second diameter 144, where the first diameter 142 is larger than the second diameter 144. In this configuration, the first rate of rotation 22 of the outer control ring 14 is substantially reduced to a fourth rate of rotation 146 of the encoder shaft 28 as a result of the inner reduction mechanism 140 of the inner gearing mechanism 30. Accordingly, minute adjustment of the encoder shaft 28 is possible that can result in minute modifications of the various functions of the appliance 12.

By way of explanation, and not limitation, the outer control ring 14 of the control knob 10 can be configured to operate the temperature control functions of the appliance 12. In this manner, as the user rotates the outer control knob 10 a certain angular distance at the first rate of rotation 22 to achieve a desired temperature of the appliance 12, the inner reduction mechanism 140 of the inner gearing mechanism 30 reduces the amount of rotation of the outer control ring 14, such that the encoder shaft 28 for controlling the temperature rotates a smaller angular distance at the fourth rate of rotation 146 to achieve finite and incremental adjustments of the temperature control of the appliance 12. According to various embodiments, the inner reduction mechanism 140 of the inner gearing mechanism 30, which reduces the rotational input of the outer control ring 14 to a decelerated rotation of the encoder shaft 28 is juxtaposed by the accelerated rotation of the indicial ring 24 at the faster second rate of rotation 26, relative to the rotation of the outer control ring 14. The resulting user experience is that the user can adjust a particular function of the appliance 12, such as the temperature of a cooking function, through less than a full rotation of the outer control ring 14. Accordingly, it is possible that a single turn of a user's wrist to operate the outer control ring 14 can engage the cooking function and also set the predetermined temperature without the user having to release and re-grip the outer control ring 14 to further adjust the outer control ring 14 to set the cooking temperature to the desired parameter.

Referring again to FIGS. 9-17, the rotation modulating mechanism 18 of the control knob 10 can include a plurality of planetary gears 40 that are engaged with the outer control ring 14 at planetary seats 48 defined within a transfer portion 160 of the outer control ring 14. The planetary seats 48 of the outer control ring 14 can engage the planetary gears 40 at one side of each planetary gear 40. Additionally, a planetary guide ring 162 can engage the planetary gears 40 at the opposing side to securely position the planetary gears 40 within the transfer portion 160 of the outer control ring 14. In such an embodiment, the planetary guide ring 162 can include planetary seats 48 that cooperate with the planetary seats 48 of the outer control ring 14 to fix each planetary gear 40 within respective planetary rotational axes 164. In this configuration, the planetary gears 40 are configured to rotate within the respective planetary rotational axis 164 relative to the outer control ring 14 and also revolve about the sun gear 42 of the stationary hub 16.

Referring again to FIGS. 9-17, the planetary guide ring 162 provides a structural support for the planetary gears 40 such that a robust rotation modulating mechanism 18 can be provided within the control knob 10. The planetary guide ring 162 also serves to structurally engage the planetary gears 40 to the outer control ring 14 such that the outer control ring 14 and the rotation modulating mechanism 18 can rotate as a single unit within the control knob 10. In this manner, as the outer control ring 14 rotates about the stationary hub 16, the rotation modulating mechanism 18, which rotates at the first rate of rotation 22 along with the outer control ring 14, can modulate the first rate of rotation 22 of the outer control ring 14 into the second rate of rotation 26 of the indicial ring 24 that engages the planetary gears 40 of the rotation modulating mechanism 18. Accordingly, the indicial ring 24 is allowed to freely rotate about the rotation modulating mechanism 18 at the second rotational rate, where the rotation of the indicial ring 24 is independent of, but proportionally tied to, the rotation of the outer control ring 14 and the rotation modulating mechanism 18 at the first rate of rotation 22.

Referring again to FIGS. 9-17, in order to provide additional structural support for the various components of the control knob 10, the stationary hub 16 can include the perimetrical wall 70 that extends from the hub flange 92. The hub flange 92 can define a portion of the external surface 170 of the control knob 10. The perimetrical wall 70 extends inward from the hub flange 92 toward the knob base 98 and is affixed thereto to form a substantially unified structure of the control knob 10. In this manner, the hub flange 92 of the stationary hub 16 and the knob base 98 substantially contain at least some of the operable portions of the control knob 10 therebetween. In this manner, the hub flange 92 can be configured to extend at least partially over a hub seat 180 of the indicial ring 24 wherein the engagement of the hub seat 180 and the hub flange 92 limits the non-rotational movement of the indicial ring 24 relative to the stationary hub 16. It is contemplated that the hub seat 180 can define an inner aperture 182 of the indicial ring 24 through which the perimetrical wall 70 can extend to engage the knob base 98 and also within which the rotation modulating mechanism 18 can rotate to engage the accelerating gear 44 of the indicial ring 24 with the planetary gears 40.

Referring again to FIGS. 2-10, in order to further secure the indicial ring 24 to the hub flange 92 of the stationary hub 16, the indicial ring 24 can include an indicial bracket 190 that is coupled to a portion of the indicial ring 24 and which extends over a portion of the hub flange 92 to further secure the engagement between the indicial ring 24 and the hub flange 92 of the stationary hub 16. In this embodiment, the indicial bracket 190 rotates around and over the hub flange 92 during operation of the outer control ring 14. Accordingly, the engagement between the perimetrical wall 70 of the stationary hub 16 and the knob base 98 to substantially fix the lateral positions of the operable components of the control knob 10 provides a robust structure within which the control knob 10 can be operated. This configuration can also substantially limit the amount of non-rotational movement, wobble, wiggle, or other lateral or axial displacement of the various components of the control knob 10 during operation. This robust configuration can also provide for substantially smooth rotational operation of the various components of the control knob 10 which can enhance the life of the control knob 10 and also enhance the customer experience of the control knob 10 and the appliance 12. Additionally, this robust control configuration can provide for substantially greater precision in setting the various parameters of the functions of the appliance 12.

According to the various embodiments, as illustrated in FIGS. 2-17, the rotation modulating mechanism 18 can include an external portion 210 that corresponds to at least the outer control ring 14 and an internal portion 212 that corresponds to at least the indicial ring 24. In such an embodiment, rotation of the external portion 210 of a first angular distance at the first rate of rotation 22 causes the internal portion 212 of the rotation modulating mechanism 18 to rotate at a second angular distance at the second rate of rotation 26, with the first angular distance being different from the second angular distance. In such an embodiment, an inner rotational mechanism 214 having the encoder shaft 28 and the inner transfer mechanism that corresponds to the inner gearing mechanism 30 can also be included. In such an embodiment, the encoder shaft 28 is rotationally connected to the appliance control 60 and the inner gearing mechanism 30. The inner gearing mechanism 30 can engage either the external or internal portion 210, 212 of the rotation modulating mechanism 18 to place a portion of the rotation modulating mechanism 18 in communication with the appliance control 60. A rotation of the external portion 210 in the first rotational direction 122 can cause a rotation of the encoder shaft 28 in the second rotational direction 124 that is opposite the first rotational direction 122.

Referring again to FIGS. 1-17, the control knob 10 can include an auxiliary control ring 250 that is proximate the outer control ring 14. The auxiliary control ring 250 rotates independently of the outer control ring 14 and is in communication with a function encoder 252 for operating a separate portion of the appliance control 60 than that of the encoder shaft 28. According to the various embodiments, the appliance control 60 can include a temperature control and a function control, wherein the temperature control is in communication with the encoder shaft 28 and the function control is in communication with the function encoder 252. It is contemplated that the auxiliary control ring 250 can cooperate with the function control through the function encoder 252 for operating various cooking functions that can include, but are not limited to, conventional baking, convection baking, roasting, convection roasting, broiling, convection broiling, steaming, various cleaning functions, other conventional cooking and convection cooking operations, gas or electric burner functions, grilling functions, and other similar cooking operations. In addition, the auxiliary control knob 10 can operate alternative user interface operations such as a Wi-Fi mode where a user can operate the cooking appliance 12 through a Wi-Fi, Bluetooth, cellular, or other wireless communications network. It is contemplated that the Wi-Fi mode can be operated through a Wi-Fi module disposed in a portion of the appliance 12, such as within the body of the appliance, or within a portion of the control knob 10.

Referring gain to FIGS. 1-17, it is contemplated that the auxiliary control ring 250 can include an outer transfer gear 280 that defines cogs that engage a function gearing mechanism 282. It is contemplated that the function gearing mechanism 282 can be similar to the inner gearing mechanism 30 in that it includes a cluster gear having an outer function gear 284 and an inner function gear 286, where the outer function gear 284 can be a different size than the inner function gear 286. The function gearing mechanism 282 can be coupled to the knob base 98 and positioned within a base wall 288 of the knob base 98. The function gearing mechanism 282 can be held at least partially within the base wall 288 and the base wall 288 can include a base wall aperture 290 through which a portion of the function gearing mechanism 282 can extend to engage the cogs of the outer transfer gear 280 of the auxiliary control ring 250 as well as the function encoder 252.

In order to provide further structural integrity of the control knob 10, the gearing of the auxiliary control ring 250 and the function gearing mechanism 282 can be maintained in a substantially separate compartment within the control knob 10 than that of the outer control ring 14, rotation modulating mechanism 18 and the indicial ring 24. In such an embodiment, the knob base 98 can include the function dividing wall 102 that extends across a portion of the knob base 98 and provides a barrier between the operations of the auxiliary control ring 250 and the operations of the outer control ring 14. It is also contemplated that the function dividing wall 102 can also serve as the support substrate 94 that receives the perimetrical wall 70 of the stationary hub 16. Accordingly, the base wall 288 of the knob base 98 can engage the base plate 100, and the perimetrical wall 70 of the stationary hub 16 can engage the function dividing wall 102 of the knob base 98. The base plate 100, the knob base 98 and the stationary hub 16 thereby form a substantially unitary structural member that retains the operable components of the control knob 10 in a fixed axial and lateral position and within which the various operable components of the control knob 10 can rotationally operate.

Referring again to FIGS. 1-17, the base plate 100, the function dividing wall 102 and the hub flange 92 define front and rear functional compartments 300, 302 within which the operable components of the control knob 10 operate. Between the base plate 100 and the function dividing wall 102 that defines the rear functional compartments 302, the function gearing mechanism 282 is secured within gearing seats 90 defined in the base plate 100 and the function dividing wall 102. A base perimeter 304 of the knob base 98 conceals the function gearing mechanism 282 and the outer transfer gear 280 and also encloses the rear functional compartment 302. The base wall 288 provides internal structure to secure the knob base 98 to the base plate 100. In this manner, the knob base 98, the base plate 100 and the base perimeter 304 and base wall 288 extending therebetween define the rear functional compartments 302 within which the function encoder 252 can be manipulated by the auxiliary control ring 250.

According to the various embodiments, as illustrated in FIGS. 2-17, the perimetrical wall 70 of the stationary hub 16 can include the sun gear 42 that engages the planetary gears 40 of the rotation modulating mechanism 18. In this manner, the sun gear 42 of the perimetrical wall 70 can provide a substantially sturdy structure to which the planetary gears 40 and, in turn, the planetary guide ring 162 and the outer control ring 14 can attach to rotate about the stationary hub 16 in a robust and fluid movement pattern. Accordingly, the unified structure of the base plate 100, the knob base 98 and the stationary hub 16, with the functional compartments defined therebetween, provides the support structure of the control knob 10. In this manner, the function dividing wall 102 defines the separating member between the front and rear functional compartments 300, 302. The front functional compartment 300 houses at least the rotation modulating mechanism 18 and the inner gearing mechanism 30 that are in communication with the encoder shaft 28. The rear functional compartment 302 houses at least the function gearing mechanism 282 that is in communication with the function encoder 252.

Referring again to FIGS. 9-17, the encoder shaft 28 and the function encoder 252 can include cogs or substantially fluted surfaces that are configured to engage the second gear portion 112 of the inner gearing mechanism 30 and the inner function gear 286 of the function gearing mechanism 282, respectively, in order to transfer the rotational operation of the outer control ring 14 and the auxiliary control ring 250 to the respective portion of the appliance control 60. Additionally, similar to the configuration of the inner gearing mechanism 30 that acts as an inner reduction mechanism 140, the engagement between the outer transfer gear 280 of the auxiliary control ring 250, the function gearing mechanism 282, and the function encoder 252 can form an auxiliary reduction mechanism 310 that reduces the rotational movement of the auxiliary control ring 250 to a proportionally lesser rotational movement of the function encoder 252. Additionally, the rotation of the function encoder 252, due to the configuration of the function gearing mechanism 282 can be in a rotational direction that is opposite of the rotational direction of the auxiliary control ring 250.

Referring now to the embodiment illustrated in FIGS. 18-25, the control knob 10 for the appliance 12 can include the outer control ring 14, the stationary hub 16, and the rotation modulating mechanism 18 in the form of a rotational reduction mechanism 330 that extends between the outer surface 20 of the stationary hub 16 and the interior surface 76 of the control ring. In such an embodiment, the outer control ring 14 is rotationally operable about the stationary hub 16. An encoder shaft 28 is disposed within the stationary hub 16, wherein an inner gearing mechanism 30 extends between an exterior surface 32 of the encoder shaft 28 and an inside surface of the rotational reduction mechanism 330. The rotational reduction mechanism 330 and the inner gearing mechanism 30 place the outer control ring 14 in operable communication with the encoder shaft 28.

According to the various embodiments, as illustrated in FIGS. 18-25, the rotational reduction mechanism 330 can include the planetary gears 40 rotationally set within a carrier 340, wherein each of the planetary gears 40 rotationally engages outward cogs, such as the sun gear 42, defined within the outer surface 20 of the stationary hub 16 and inner cogs 342 defined within the interior surface 76 of the outer control ring 14. The carrier 340 can include the planetary seats 48 that can hold both ends of the planetary gears 40 in a fixed axial position relative to the carrier 340 and allow the planetary gears 40 to rotate within the carrier 340. Accordingly, rotation of the outer control ring 14 about the stationary hub 16 results in a first angular rotation at the first rate of rotation 22 of the outer control ring 14 about the stationary hub 16, and a second angular rotation, at the second rate of rotation 26, of the rotational reduction mechanism 330, including the planetary gears 40 and the carrier 340, about the stationary hub 16. In such an embodiment, the first angular rotation of the outer control ring 14 is greater than the second angular rotation of the rotational reduction mechanism 330, wherein the carrier 340 rotates slower than the outer control ring 14.

Referring again to FIGS. 18-25, as the outer control ring 14 is operated by the user, the interior surface 76 of the outer control ring 14 causes the planetary gears 40 to rotate within the planetary seats 48 of the carrier 340. This rotation of the planetary gears 40 causes the carrier 340, to which the planetary gears 40 are attached, to rotate about the sun gear 42 of the stationary hub 16 at a different and slower rotational speed than that of the outer control ring 14. In such an embodiment, it is contemplated that the indicial ring 24 of the control knob 10 can be coupled to the carrier 340 such that as the outer control ring 14 is rotated, the indicial ring 24 rotates with the carrier 340 at a slower second rate of rotation 26. Accordingly, a predetermined rotational movement of the outer control ring 14 results in a proportionately lesser rotational movement of the carrier 340 and the indicial ring 24, such that proportionately greater rotation of the outer control ring 14 is necessary in order to rotate the indicial ring 24 the desired angular distance. Such a configuration can be useful where a user may desire to experience small incremental movements of the indicial ring 24 that gives an indication of very precise modifications of various functions of the appliance 12, in response to the user's movement of the outer control ring 14 about the stationary hub 16.

Referring again to FIGS. 22-25, the reduced rotation of the carrier 340 of the rotational reduction mechanism 330 can then be transferred to the encoder shaft 28 through the inner gearing mechanism 30. In such an embodiment, the carrier 340 can extend from the planetary gears 40 and toward the appliance 12 to engage the inner gearing mechanism 30. As discussed above, the inner gearing mechanism 30 can be positioned within a portion of the stationary hub 16, where the inner gearing mechanism 30 extends through the perimetrical wall 70 of the stationary hub 16 to engage the carrier 340. In this manner, the movement of the carrier 340 can be transferred to the inner gearing mechanism 30, and, in turn, to the encoder shaft 28.

According to the various alternate embodiments illustrated in FIGS. 18-25, the control knob 10 can include two reduction mechanisms in the form of the rotational reduction mechanism 330 and the inner gearing mechanism 30. Accordingly, as the user rotates the outer control knob 10, the outer control knob 10 engages the planetary gears 40 that are seated within the carrier 340. The carrier 340 and the planetary gears 40 rotate at a slower second rate of rotation 26 than that of the outer control ring 14 such that the rotational movement of the outer control ring 14 is reduced according to a predetermined gearing ratio provided by the engagement of the planetary gears 40 between the outer control ring 14 and the sun gear 42 of the stationary hub 16. The ratio of the rotational reduction between the outer control ring 14 and the carrier 340 of the rotational reduction mechanism 330, including the indicial ring 24, can be within varying ranges of from approximately 1.1-1.0 to approximately 2.0-1.0, wherein greater rotational movement of the outer control ring 14 is necessary to rotate the carrier 340 and the indicial ring 24 the desired angular distance. The movement of the carrier 340 is then reduced again through the engagement of the carrier 340 with the inner gearing mechanism 30, where the inner gearing mechanism 30 is configured to be substantially similar to that described above in the other embodiments. Through this dual reduction of the movement of the outer control ring 14, substantially precise incremental modifications of various functions of the appliance control 60 can be achieved.

Referring again to the embodiments illustrated in FIGS. 22-25, the inner gearing mechanism 30 can include the cluster gear having the first and second gear portions 110, 112, where the first gear portion 110 engages the carrier 340 and wherein the second gear portion 112 engages the encoder shaft 28 to transfer the rotation of the carrier 340 to the encoder shaft 28. In this manner, the rotation of the outer control ring 14 in a first rotational direction 122 causes the encoder shaft 28 to rotate in a second rotational direction 124 that is opposite the first rotational direction 122.

Referring again to FIGS. 18-25, various embodiments of the rotation modulating mechanism 18 can include the internal and external portions 212, 210 thereof. The internal portion 212 of the rotation modulating mechanism 18 can include at least the planetary gears 40 set within the carrier 340, wherein each of the planetary gears 40 extend between the sun gear 42 of the stationary hub 16 and the external portion 210 of the rotation modulating mechanism 18 that can be in the form of at least the outer control ring 14. As discussed above, the carrier 340 can include the planetary seats 48 that hold the planetary gears 40 in the fixed axial position, and also allow for independent but proportional movement of the carrier 340 within and relative to the outer control ring 14.

Referring again to FIGS. 22-25, the stationary hub 16 can include the perimetrical wall 70 that extends from the knob base 98 to the hub flange 92. It is contemplated that the hub flange 92 of the stationary hub 16 can serve to position the carrier 340 in a fixed axial position and provide for the robust and secure placement of the carrier 340 such that the movement of the outer control ring 14, the planetary gears 40 and the carrier 340 can be robust, substantially free of non-rotational movement, and fluid during operation of the control knob 10. It is also contemplated that the appliance control 60, in the form of the encoder shaft 28, can be in communication with the interior volume 72 of the stationary hub 16, where the rotational reduction mechanism 330, in the form of the carrier 340 and the planetary gears 40 are in rotational engagement with the outer surface 20 of the stationary hub 16.

Figure 2:
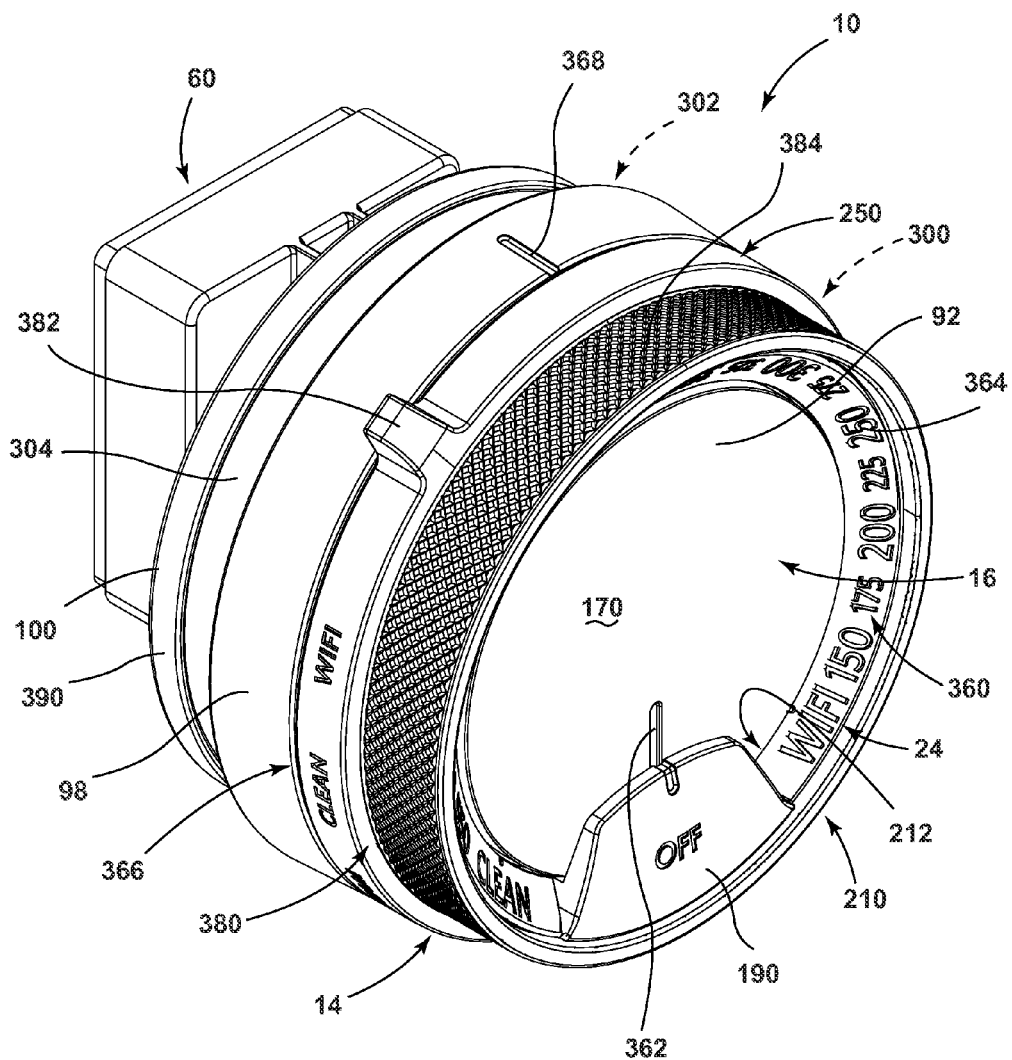
FIG. 2 is a top perspective view of the multi-function appliance knob of FIG. 1.
Figure 3:
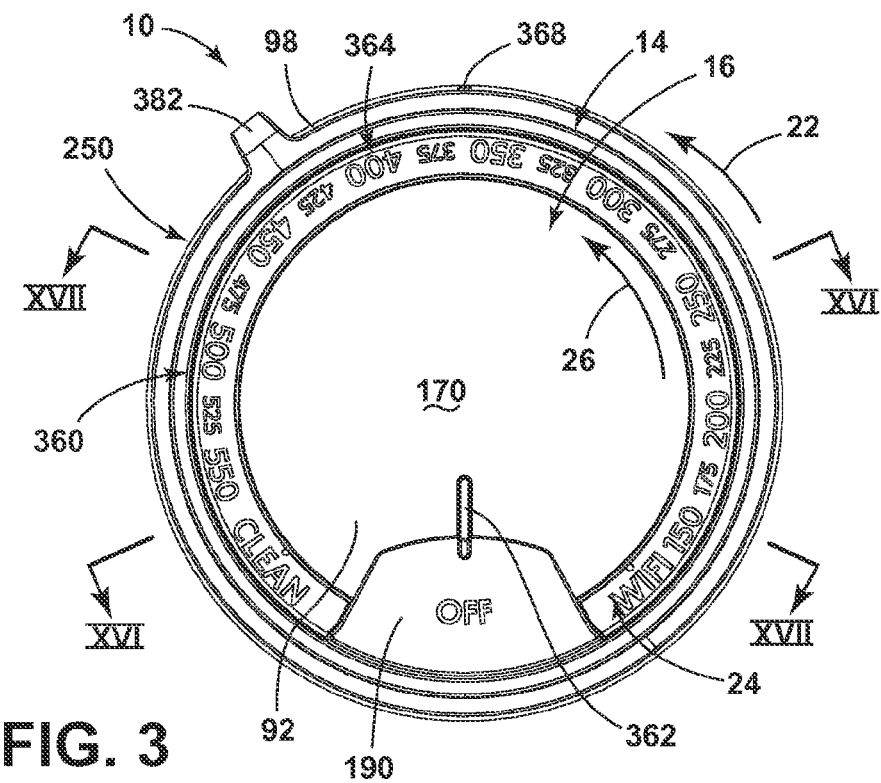
FIG. 3 is a front elevational view of the multi-function appliance knob of FIG. 2.
Figure 4:
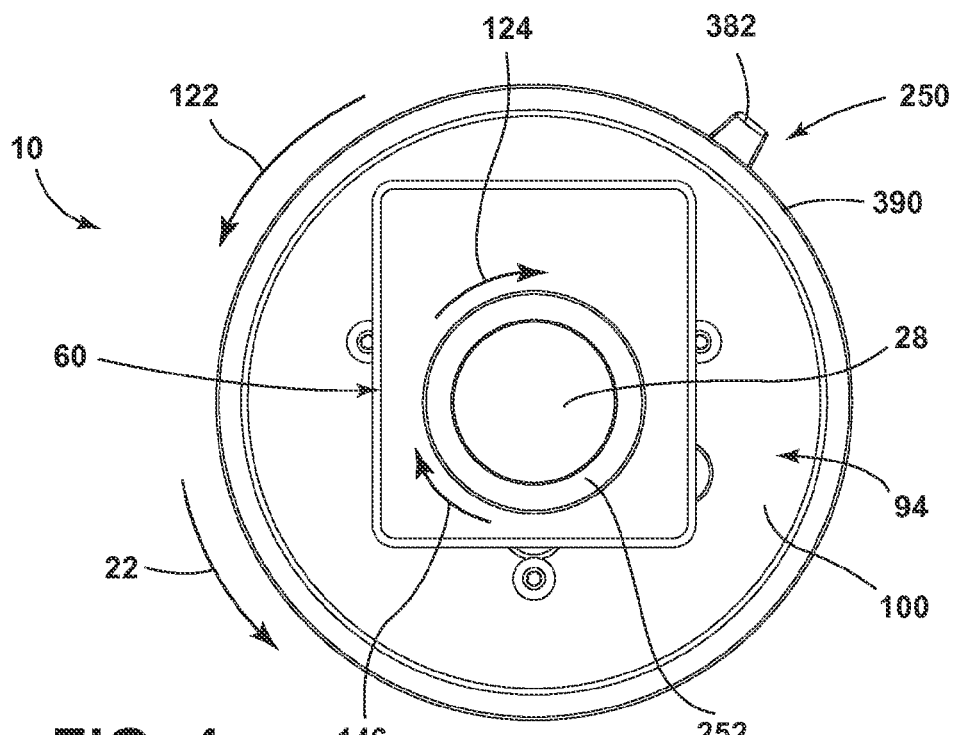
FIG. 4 is a rear elevational view of the multi-function appliance knob of FIG. 2.
Figure 5:
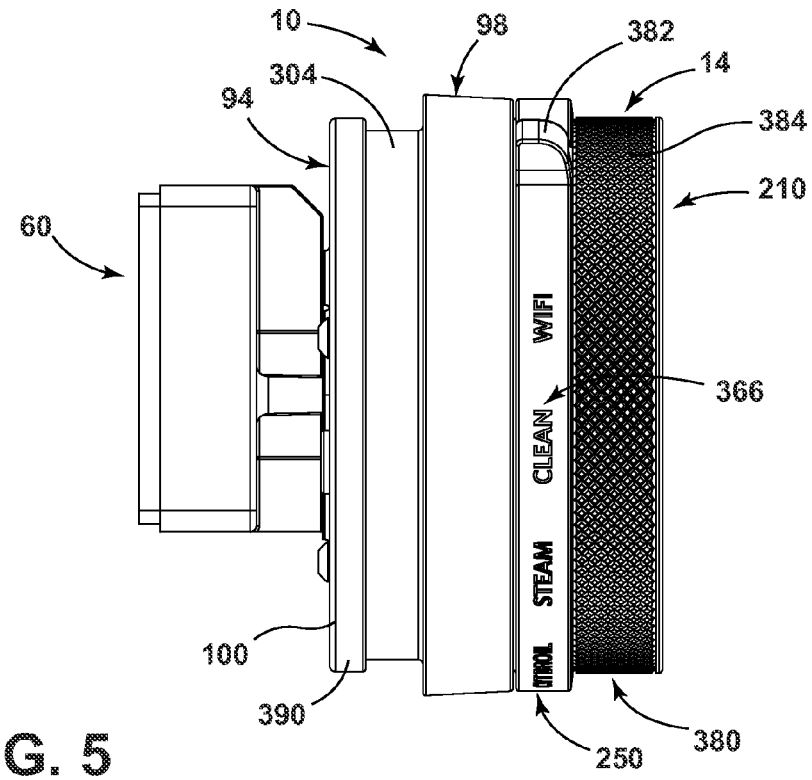
FIG. 5 is a first side elevational view of the multi-function appliance knob of FIG. 2.
Figure 6:
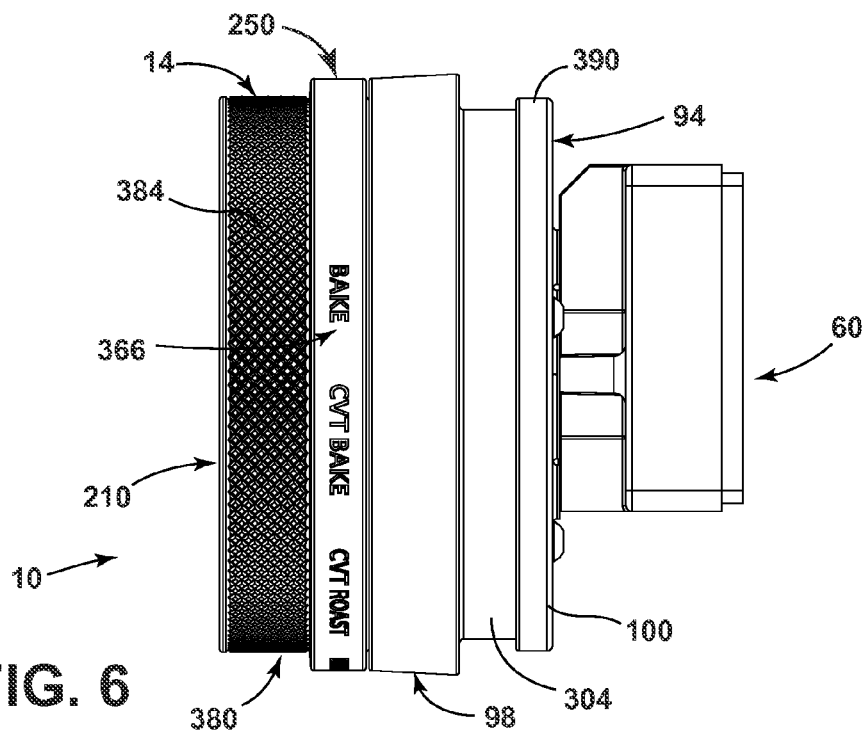
FIG. 6 is a second side elevational view of the multi-function appliance knob of FIG. 2.
Figure 9:
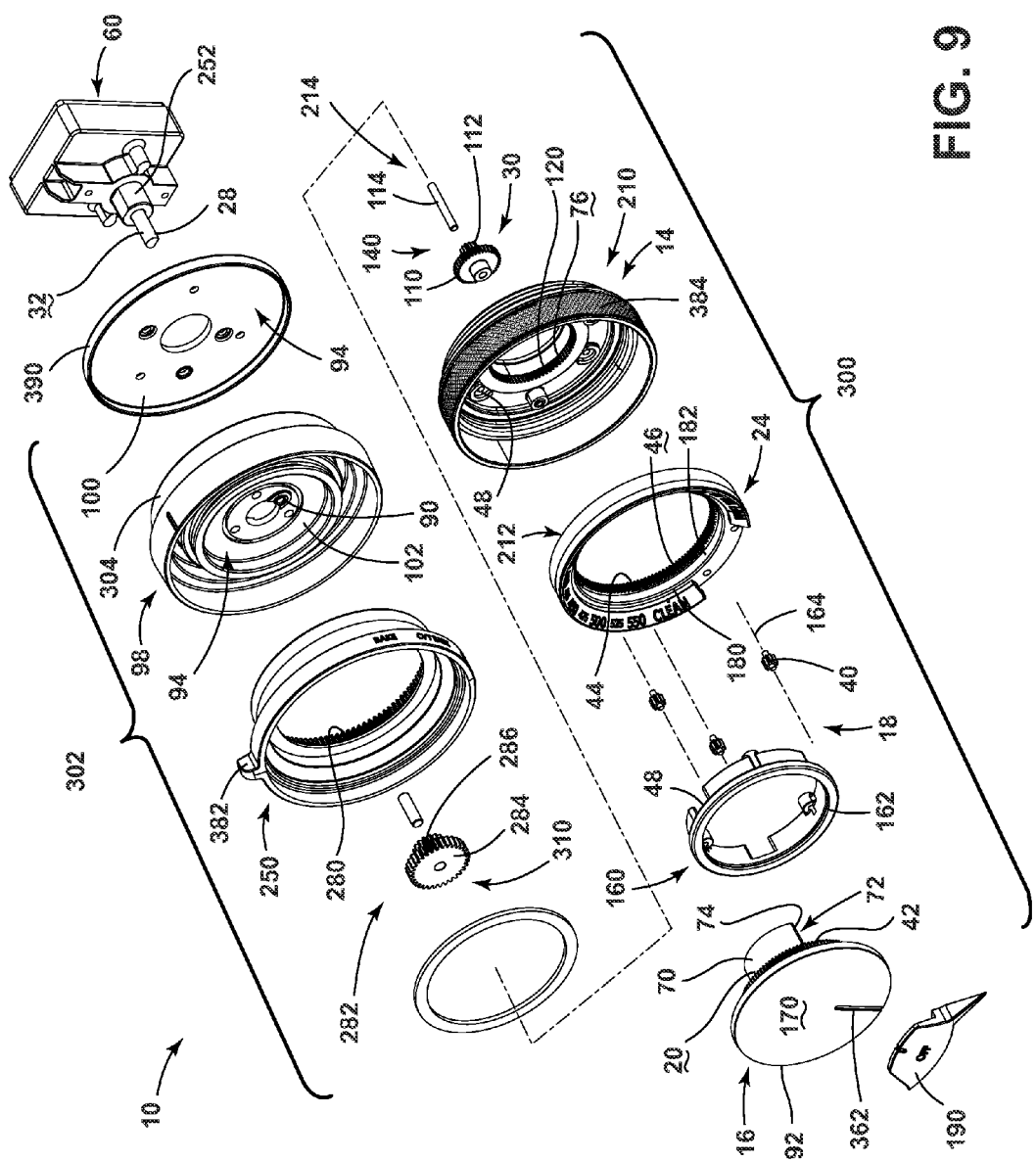
FIG. 9 is an exploded front perspective view of the multi-function appliance knob of FIG. 2.
Figure 10:
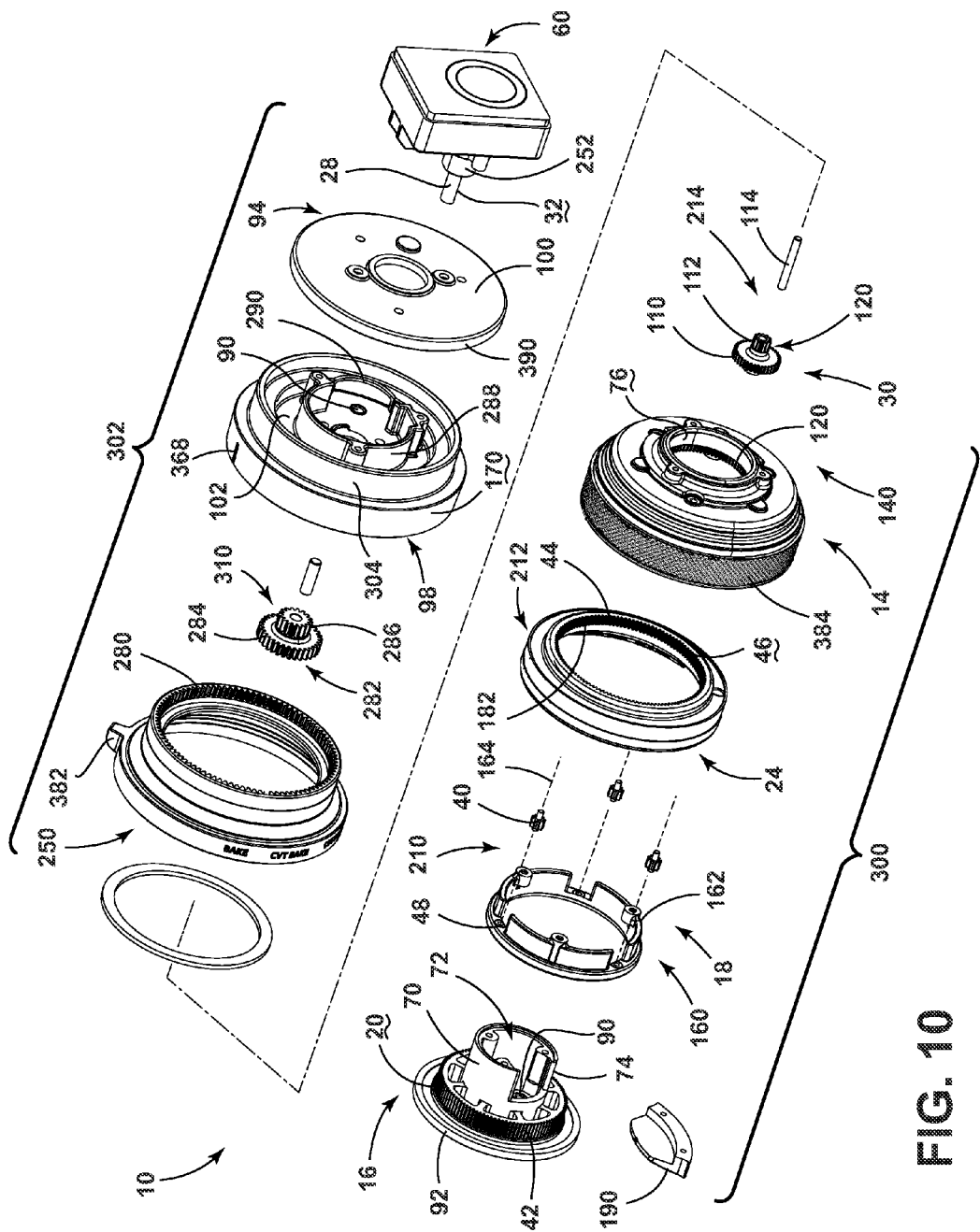
FIG. 10 is an exploded rear perspective view of the multi-function appliance knob of FIG. 2.
Figure 11:
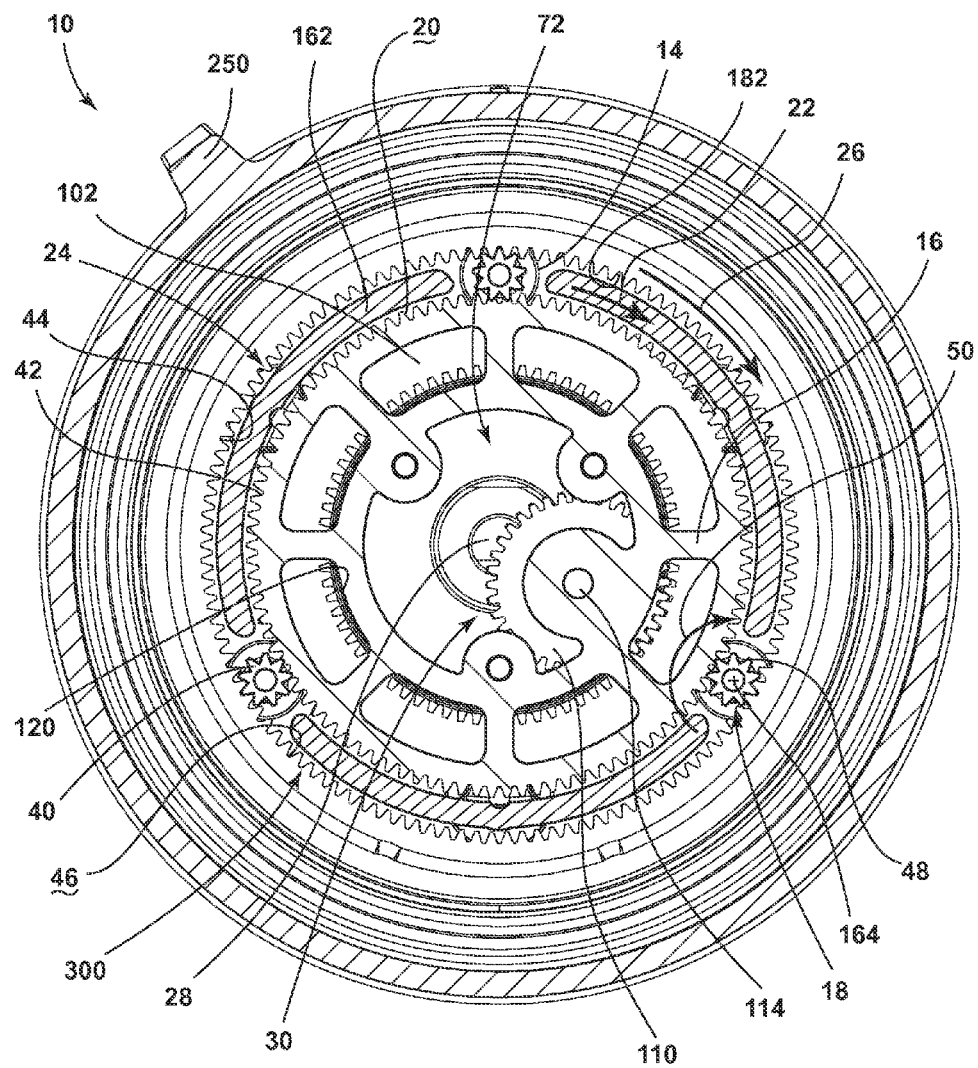
FIG. 11 is a cross-sectional view of the multi-function appliance knob of FIG. 6 taken along line XI-XI.
Figure 12:
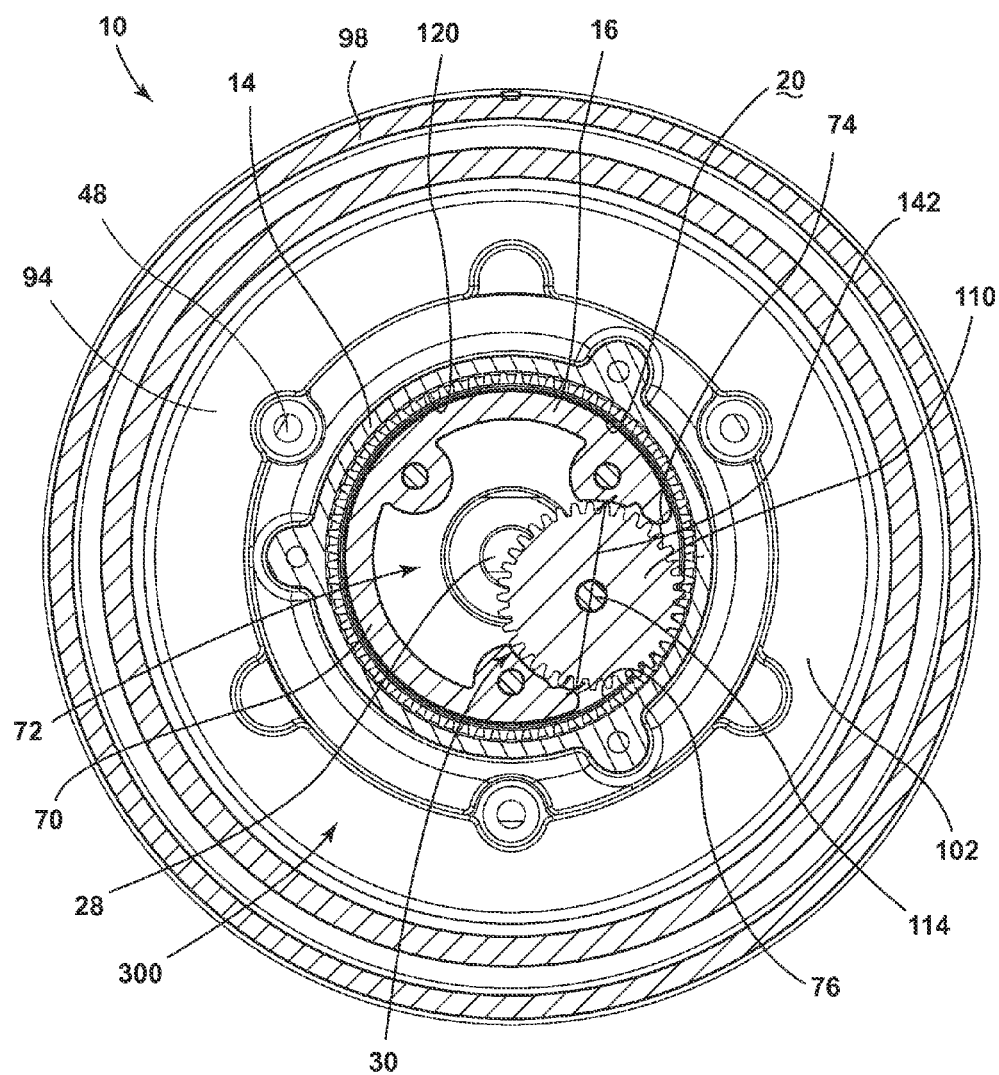
FIG. 12 is a cross-sectional view of the multi-function appliance knob of FIG. 6 taken along line XII-XII.
Figure 13:
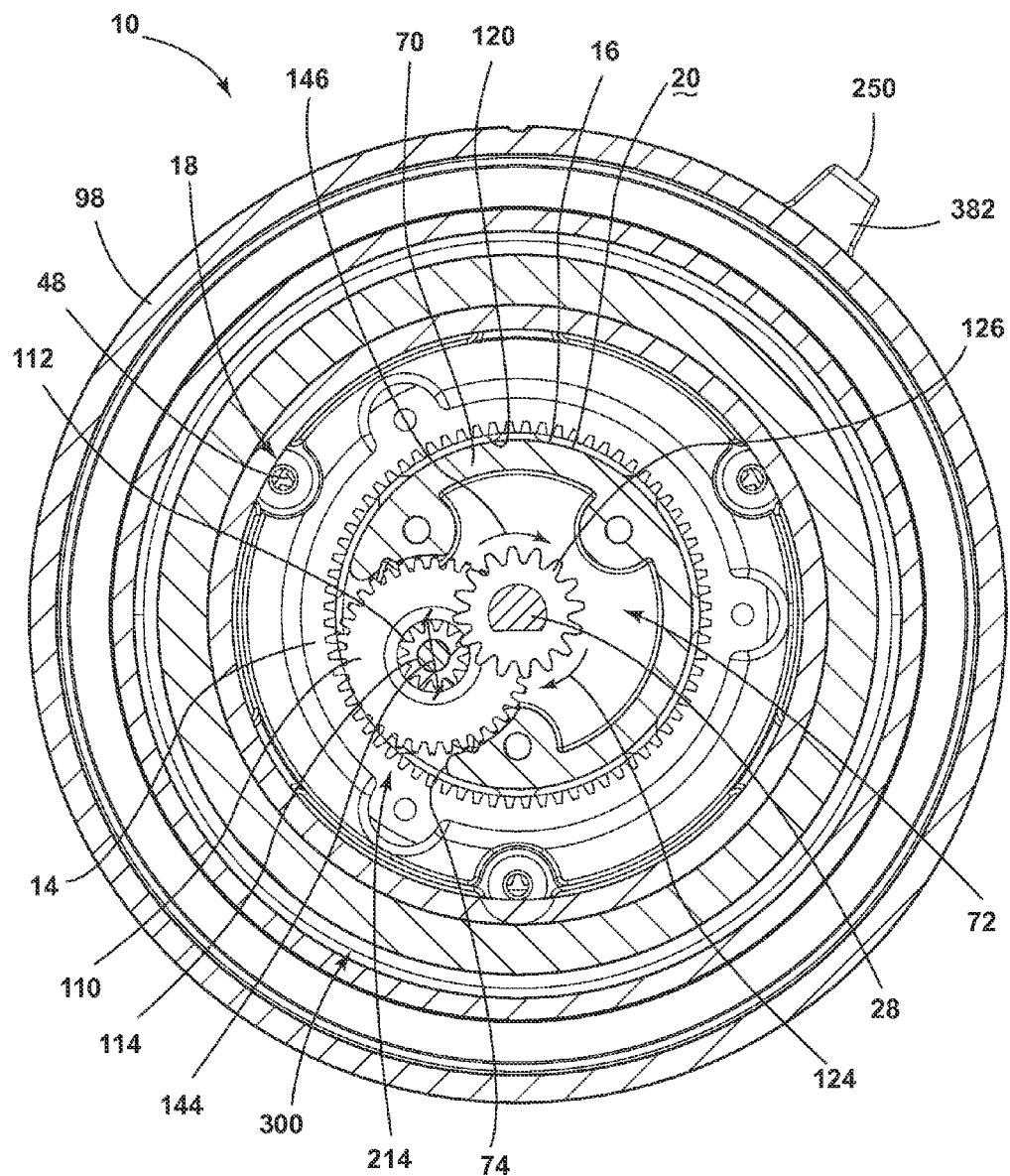
FIG. 13 is a cross-sectional view of the multi-function appliance knob of FIG. 5 taken along line XIII-XIII.
Figure 14:
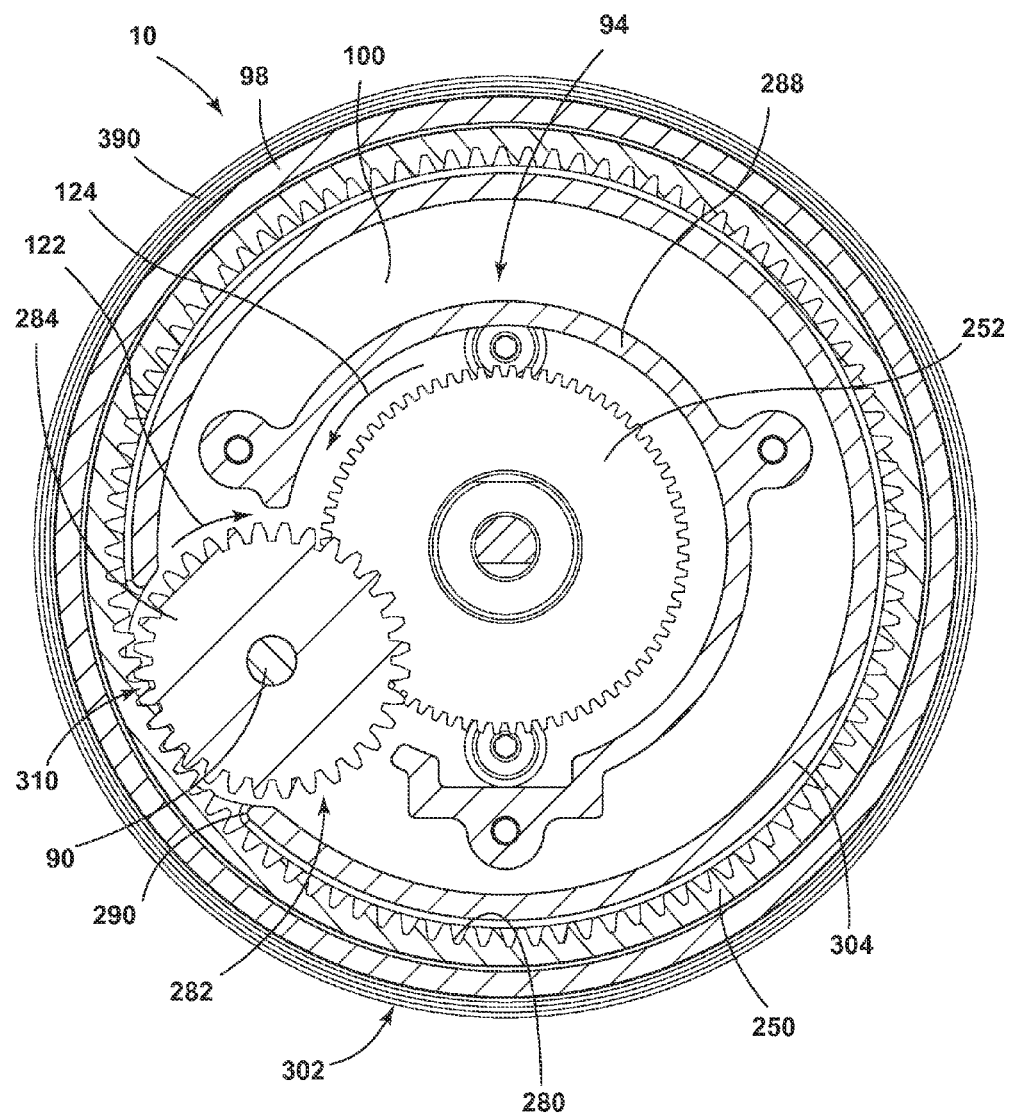
FIG. 14 is a cross-sectional view of the multi-function appliance knob of FIG. 6, taken along line XIV-XIV.
Figure 15:
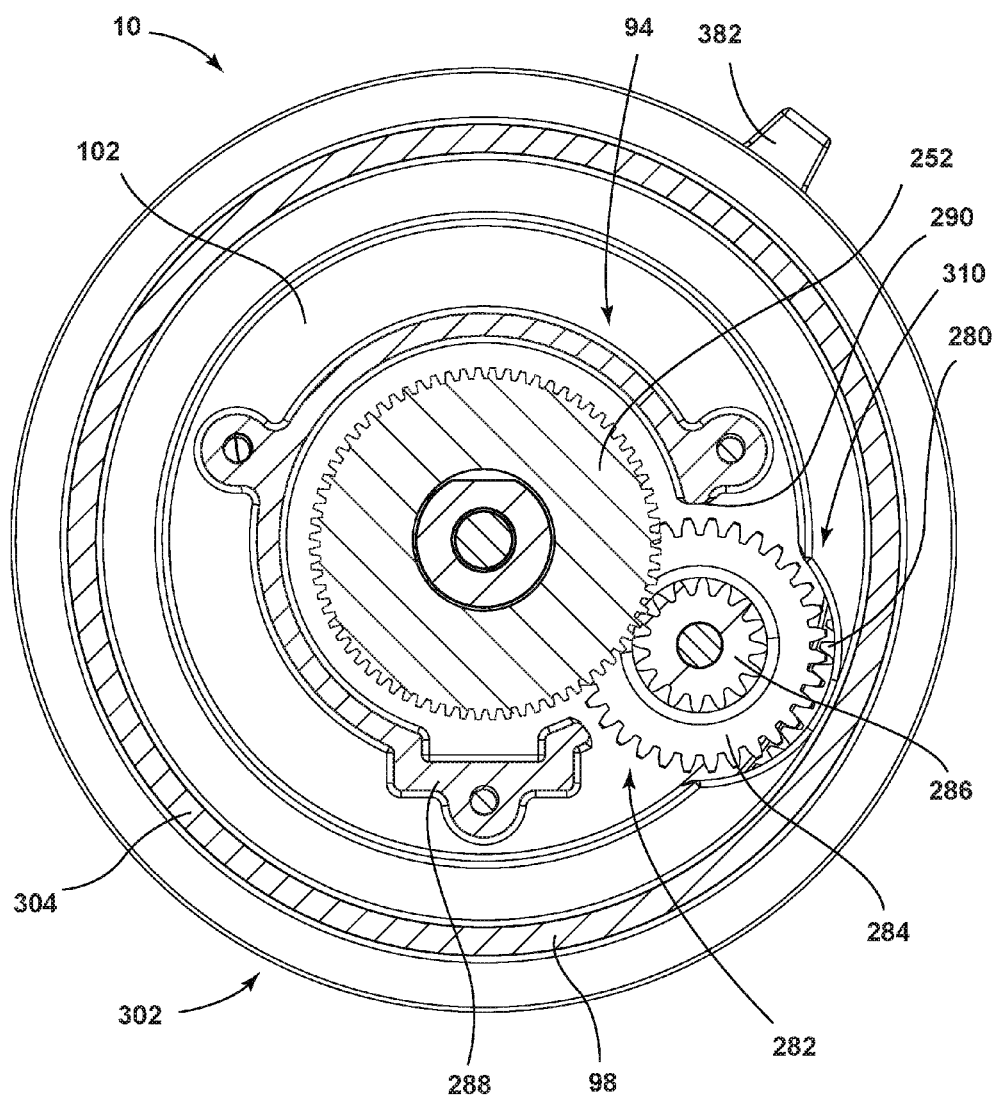
FIG. 15 is a cross-sectional view of the multi-function appliance knob of FIG. 5 taken along line XV-XV.
Figure 16:
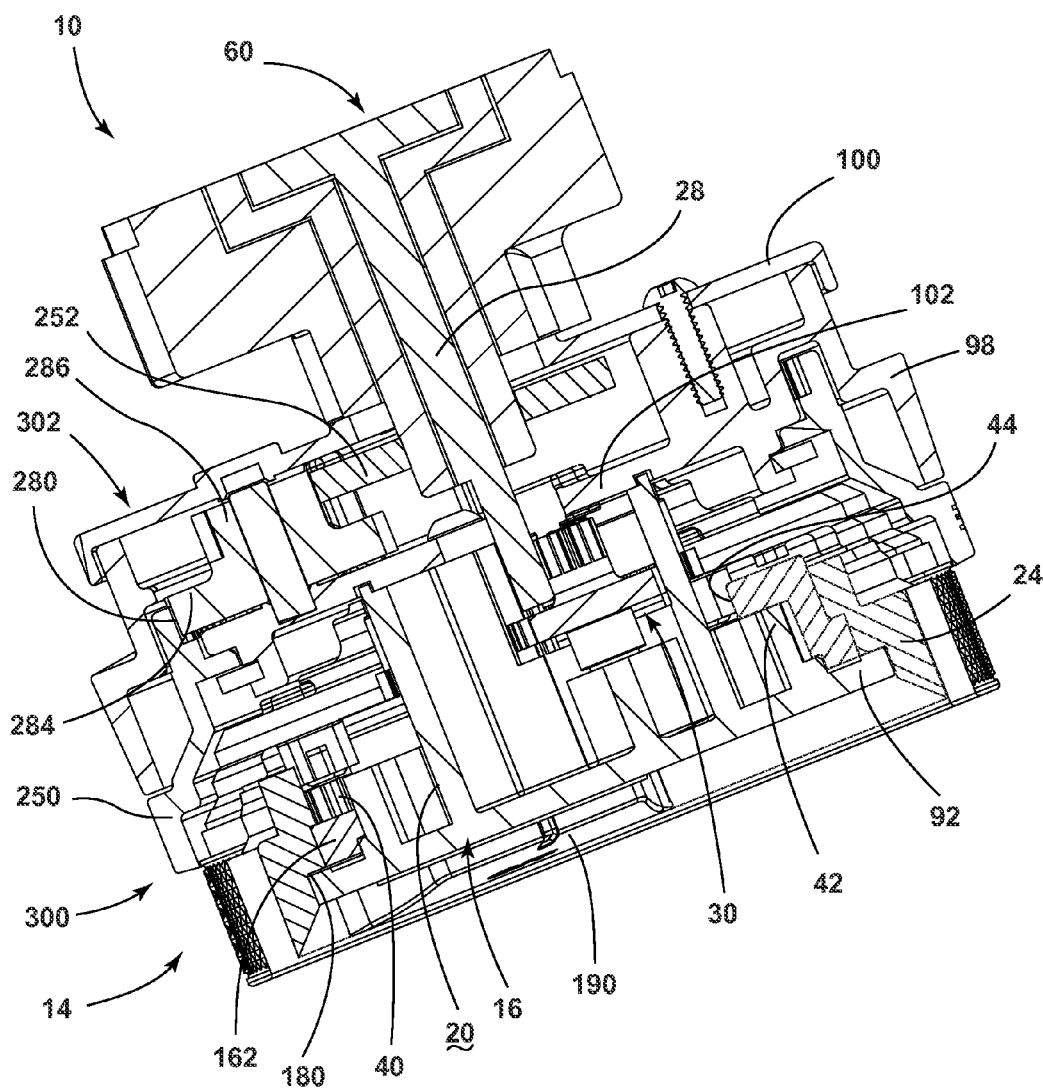
FIG. 16 is a cross-sectional view of the multi-function appliance knob of FIG. 3 taken along line XVI-XVI.
Figure 17:
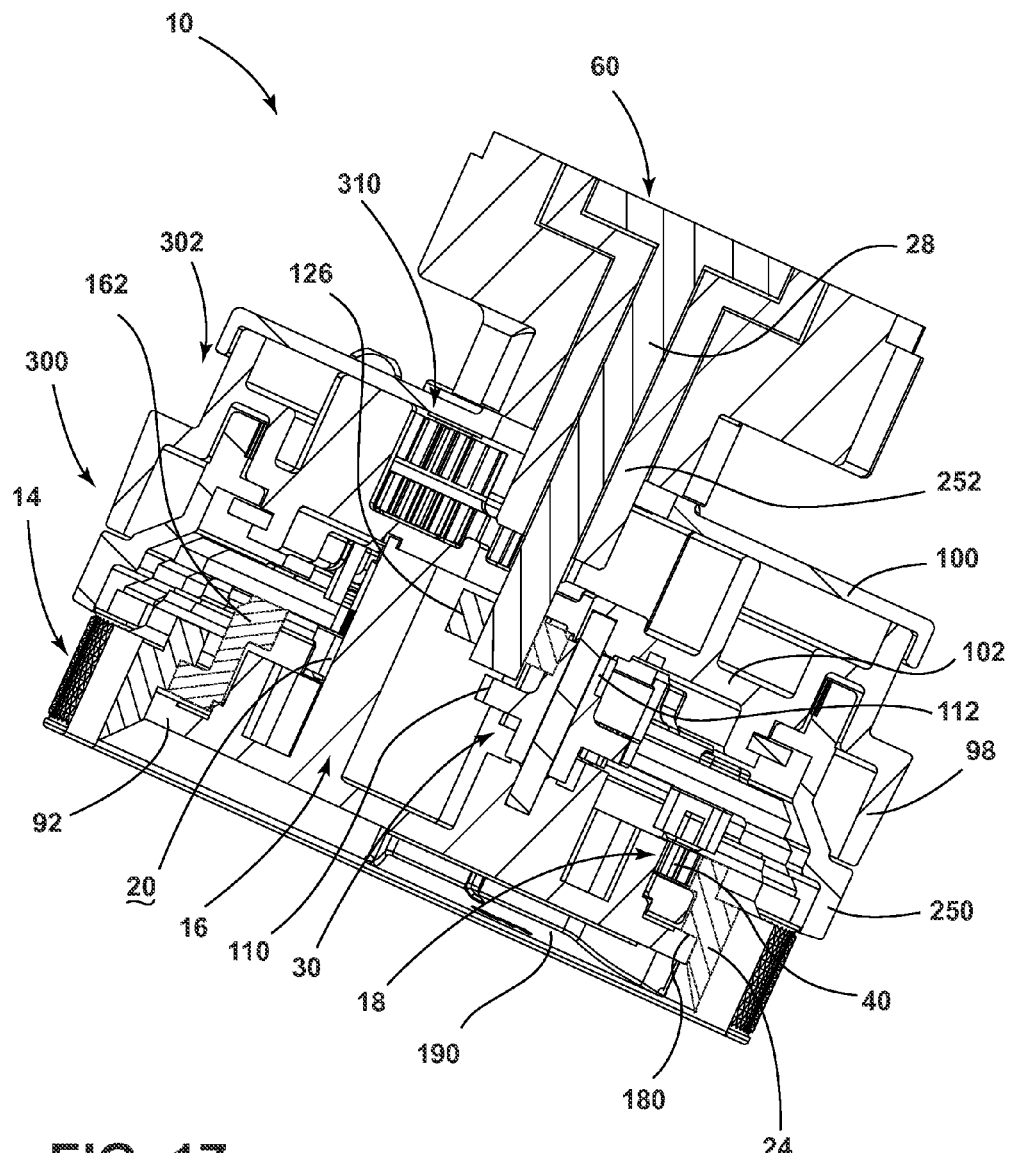
FIG. 17 is a cross-sectional view of the multi-function appliance knob of FIG. 3 taken along line XVII-XVII.
Figure 18:
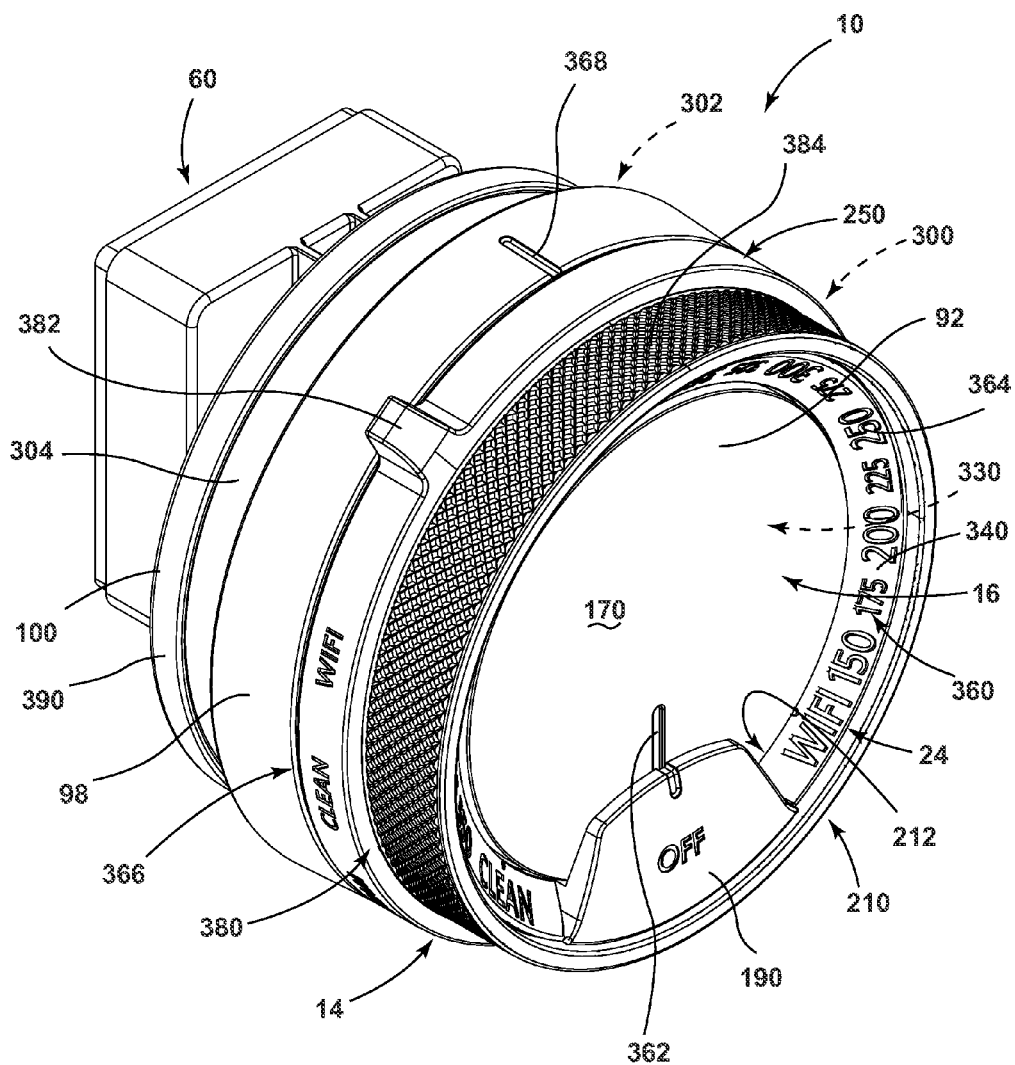
FIG. 18 is a top perspective view of an alternate embodiment of the multi-function appliance knob.
Figure 19:
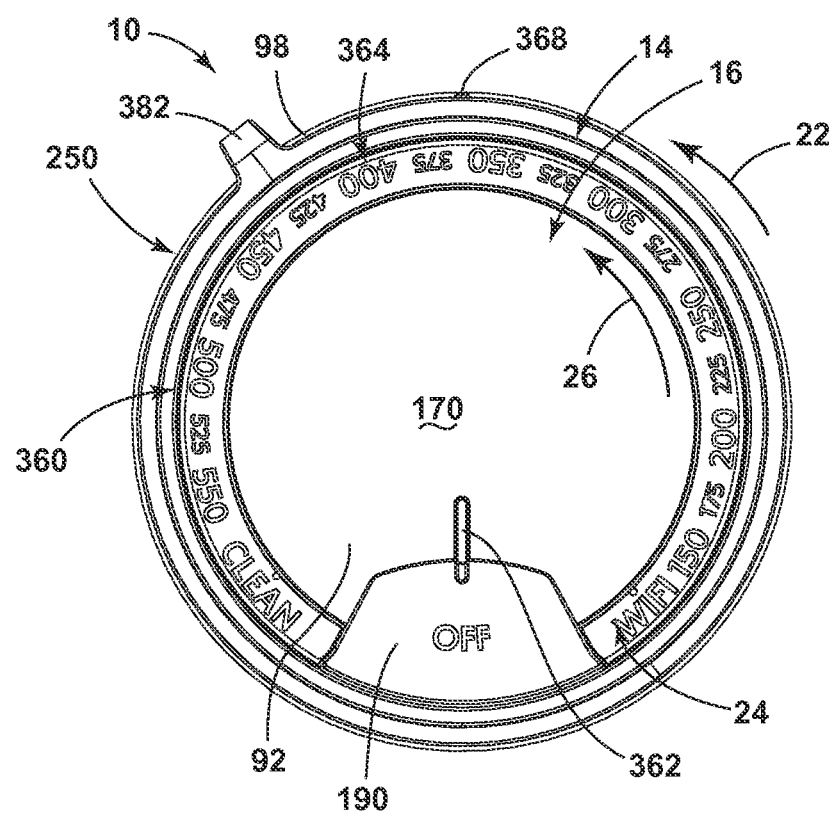
FIG. 19 is a front elevational view of the multi-function appliance knob of FIG. 18.
Figure 22:
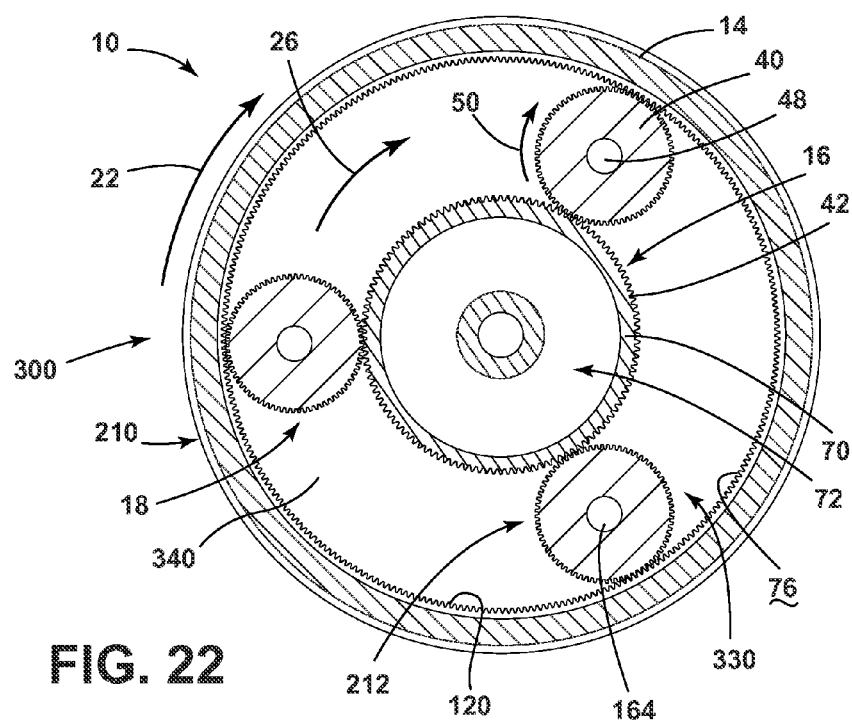
FIG. 22 is a cross-sectional view of the multi-function appliance knob of FIG. 20 taken along line XXII-XXII.
Figure 23:
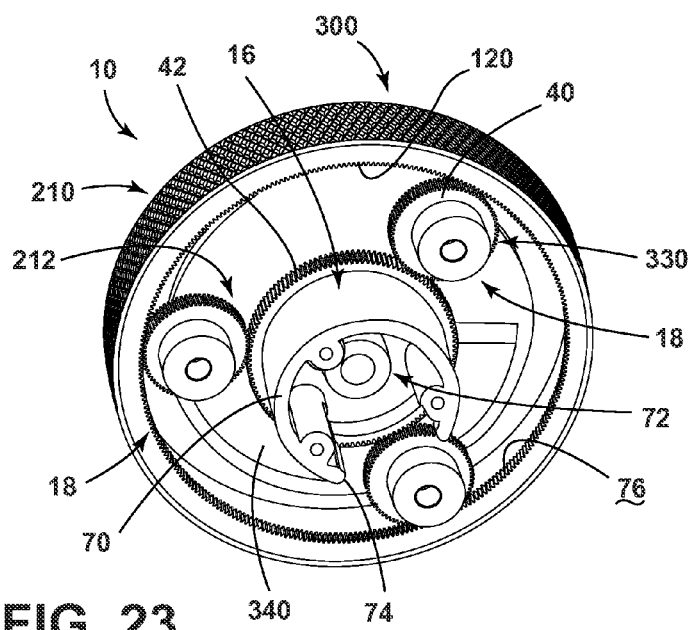
FIG. 23 is a partially exploded rear perspective view of the multi-function appliance knob of FIG. 18.
Figure 24:
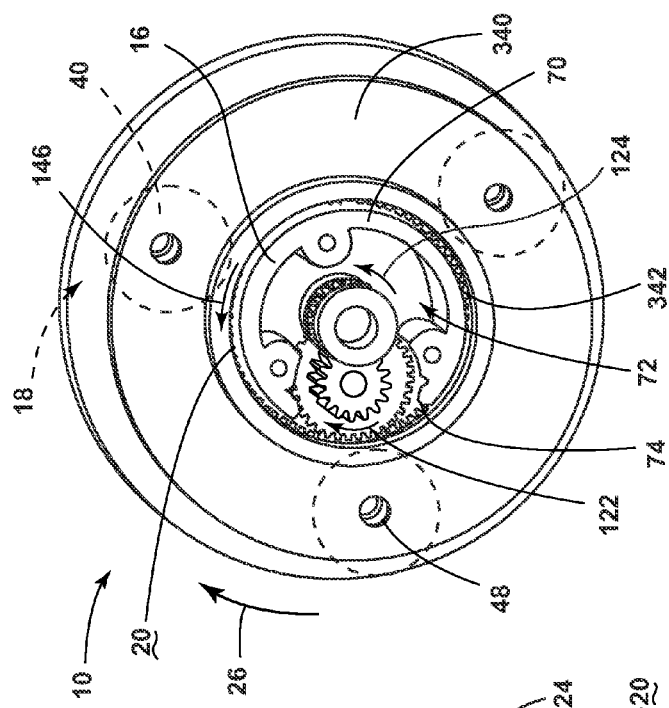
FIG. 24 is another partially exploded rear perspective view of the multi-function appliance knob of FIG. 18.
Figure 25:
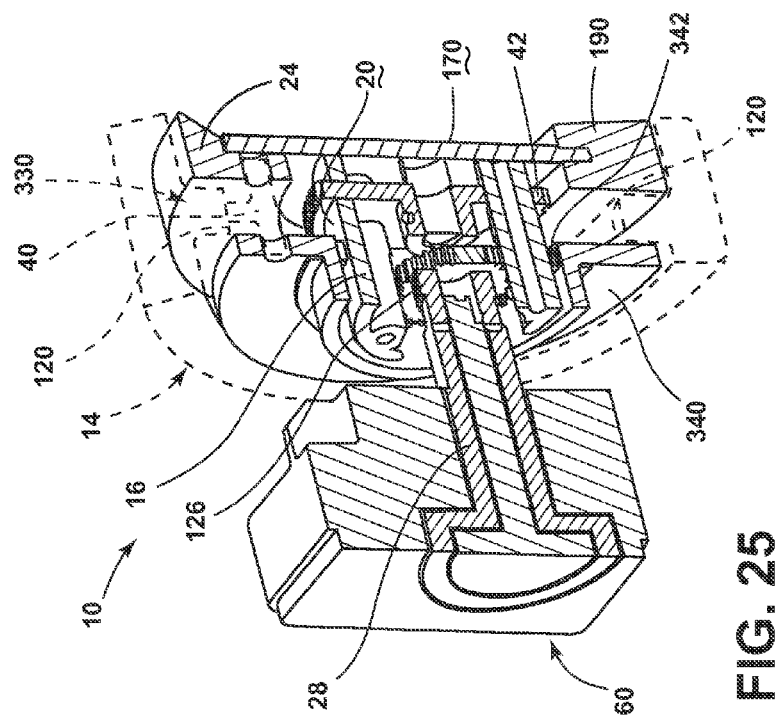
FIG. 25 is a cross-sectioned perspective view of the multi-function appliance knob of FIG. 18 taken along line XV-XV.

Referring now to the various embodiments illustrated in FIGS. 2 and 18, the control knob 10 can include various indicial markers 360 for indicating to the user the exact function parameter that has been selected. Accordingly, in various embodiments, the hub flange 92 can include an indicial ring marker 362 that cooperates with the temperature control indicia 364 on the indicial ring 24 and the indicial bracket 190. The temperature control indicia 364 disposed within the indicial ring 24 and the indicial bracket 190 cooperate with the indicial ring marker 362 to communicate to the user the exact temperature that has been selected by the user as a result of the user rotating the outer control knob 10. As discussed above, the indicial ring 24 may rotate at a faster or slower rotational speed than the outer control ring 14 depending upon the specific components incorporated within the control knob 10. In the various embodiments, the indicial ring marker 362 can be configured to communicate substantially precise movements of the indicial ring 24 caused by the user's rotation of the outer control ring 14. Similarly, the auxiliary control ring 250, having the various function indicia 366 disposed thereon can cooperate with a function indicator 368 disposed upon the knob base 98. As the user operates the auxiliary control ring 250, the function indicia 366 disposed upon the auxiliary control ring 250 can be positioned proximate the function indicator 368 on the knob base 98.

According to various embodiments, it is contemplated that the function indicator 368 can be coupled to a detent mechanism or other temporary position fixing mechanism for specifically positioning the function indicia 366 disposed upon the auxiliary control ring 250 in the proper position relative to the function indicator 368. The various positioning mechanisms for the auxiliary control ring 250 can include detents, a ratcheting-type mechanism, alternative lighting indicia that activates when a particular function indicia 366 is placed in a predetermined position relative to the function indicator 368, various other auditory, visual, haptic, tactile, or other similar feedback communicated to the user during operation of the control knob 10.

According to various embodiments, it is contemplated that the temperature control indicia 364 of the indicial ring 24, as well as the function indicia 366 of the auxiliary control ring 250 can include an internal lighting mechanism. This internal lighting mechanism can illuminate a corresponding indicia as the outer control ring 14 and the auxiliary control ring 250 are rotated to select the various temperatures and functions of the appliance 12. In such an embodiment, as the outer control ring 14 is rotated, the indicial ring 24 also rotates such that the corresponding temperature control indicia 364 aligns with the internal illumination device to indicate to the user the temperature that has been selected. Similarly, as the user rotates the auxiliary control ring 250, the various function indicia 366 are similarly rotated to align with the internal illumination device to communicate to the user which function indicia 366 has been selected.

According to an alternate embodiment, it is contemplated that the rotation of the outer control ring 14, the auxiliary control ring 250, or both, can rotate the internal illumination device such that the temperature control indicia 364 and the function indicia 366 remain substantially stationary and the operation of the outer control ring 14 and the auxiliary control ring 250 rotates the internal illumination device to communicate to the user the selected temperature or function of the appliance 12. In this embodiment, it is contemplated that the internal illumination device can be placed in communication with the rotation modulating mechanism 18 such that the rotation of the outer control knob 10 at the first rate of rotation 22 causes a rotation of the internal illumination device at the second rate of rotation 26.

According to various alternate embodiments, it is contemplated that the various indicia of the control knob 10 can be communicated to the user through use of a digital display, wherein the rotation of the outer control knob 10 and the auxiliary control knob 10 can serve to regulate the movement of various virtual indicia displayed on a display screen disposed on a portion of the control knob 10. It is contemplated that the virtual indicia can be disposed on a display screen contained within various portions of the control knob 10 that can include, but are not limited to, the hub flange 92 of the stationary hub 16, the knob base 98, the indicial ring 24, the control knob 10, the auxiliary control knob 10, and other portions of the control knob 10 that can be used to contain a display screen for communicating virtual indicia to a user. According to the various embodiments, this virtual indicia can be configured to rotate at a different rotational rate than that of the outer control ring 14 and/or the auxiliary control ring 250 such that a user can appreciate the rotational modulation described in the various embodiments of the control knob 10 as discussed herein.

According to the various embodiments, as illustrated in FIGS. 2-8 and 18-21, the auxiliary control ring 250 and the outer control ring 14 can include tactile structures 380 that allow the user to more easily operate the auxiliary control ring 250 and the outer control ring 14. By way of example, and not limitation, the auxiliary control ring 250 can include a protrusion 382 that extends from a portion of the auxiliary control ring 250 that the user can use to assist in the rotation of the auxiliary control ring 250 about the knob base 98 and the stationary hub 16. Similarly, again, by way of explanation, and not limitation, the outer surface 20 of the outer control ring 14 can include various textured surfaces 384 that can include, but are not limited to, etching, knurling, engraved patterns, raised surfaces, and various other gripping features that the user can engage for convenient operation of the components of the control knob 10. It is also contemplated that the auxiliary control ring 250 and the outer control ring 14 can include any one of the above tactile structures 380 and can also include the same tactile structure 380 within the respective surfaces of the auxiliary control ring 250 and the outer control ring 14.

Referring again to the embodiments illustrated in FIGS. 1-25, the entire control knob 10 can include the base plate 100 that is configured to receive the knob base 98. It is contemplated that the base plate 100 can include a trim flange 390 that extends forward of the base plate 100 and provides a concealing member that can substantially extend over a portion of the base perimeter 304 to provide both a structural containing feature that extends around a portion of the knob base 98 and also provides an aesthetic trim member that is positioned proximate the exterior wall 96 of the appliance 12.

According to the various embodiments, during installation of the control knob 10, the base plate 100 can first be attached to the exterior wall 96 of the appliance 12 and the remaining portions of the control knob 10 can be attached to the base plate 100. This direct engagement of the base plate 100 to the appliance 12 and the direct engagement of the knob base 98 to the base plate 100 can further provide a robust connection configuration that can support the various operable components of the control knob 10. It is also contemplated that the entire control knob 10, with the base plate 100 included, can be attached as a singular piece to the exterior wall 96 of the appliance 12. This robust configuration of the control knob 10 provides for substantially smooth and fluid movements of the operable components of the control knob 10 during operation and limits the amount of non-rotational movement, wobble, vibration, and other lateral or axial movements, such that only fluid rotational movement of the various components of the control knob 10 are permitted.

According to the various embodiments, the control knob 10 can be made of various sturdy materials that can include, but are not limited to, metals, metal alloys, plastic, composite, combinations thereof, and other similar sturdy and substantially rigid materials. It is also contemplated that gripping portions of the control knob 10 can include flexible grip-type materials that can include, but are not limited to, plastic, rubber, polymers and other similar materials.

According to the various embodiments, while certain gearing ratios are discussed herein, it is contemplated that alternative gearing ratios are permissible such that the result of the reduced or accelerated rotation of the indicial ring 24 results in a different rotational speed than that of the outer control ring 14. Similarly, while the inner gearing mechanism 30 and the function gearing mechanism 282 described herein includes a rotational reduction between the various portions of the respective cluster gears, it is contemplated that the inner gearing mechanism 30 and/or the function gearing mechanism 282 can be configured to provide an accelerated modulation of the rotation of the outer control ring 14, such that the encoder shaft 28 and/or the function encoder 252 rotate at a faster rotational rate than that of the outer control ring 14.

As illustrated in the various embodiments, it is contemplated that the appliance control 60 can include the encoder shaft 28 and the function encoder 252 as described above. In such an embodiment, the function encoder 252 converts the rotational movement of the outer control ring 14 and the auxiliary control ring 250 into a digital output that operates the appliance control 60 and sets the desired temperature and function of the appliance 12 as communicated by the user. According to various alternate embodiments, rather than encoders, the various temperature and function commands can be conveyed to the appliance control 60 through one or more potentiometers. The potentiometers are configured to convert the rotational movement of the outer control ring 14 and the auxiliary control ring 250 through electrical resistance to provide an analog output for operating the appliance control 60 to perform the desired temperature and function commands communicated by the user.

Figure 26:
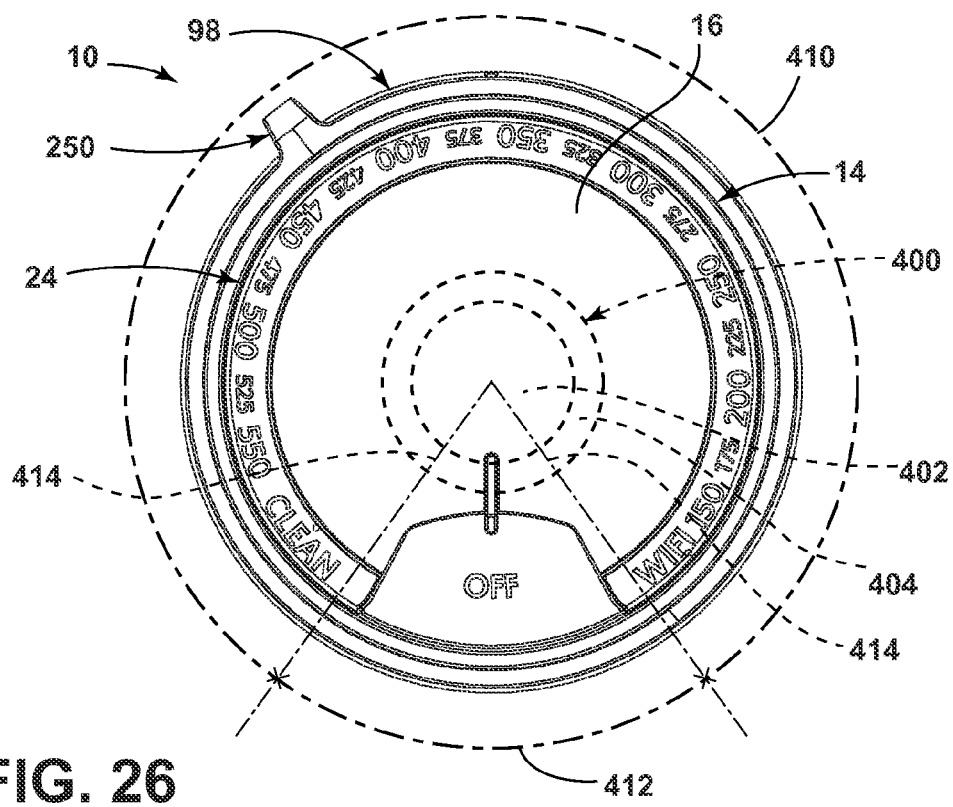
FIG. 26 is a front elevational view of another embodiment of the multi-function appliance knob.
Figure 27:
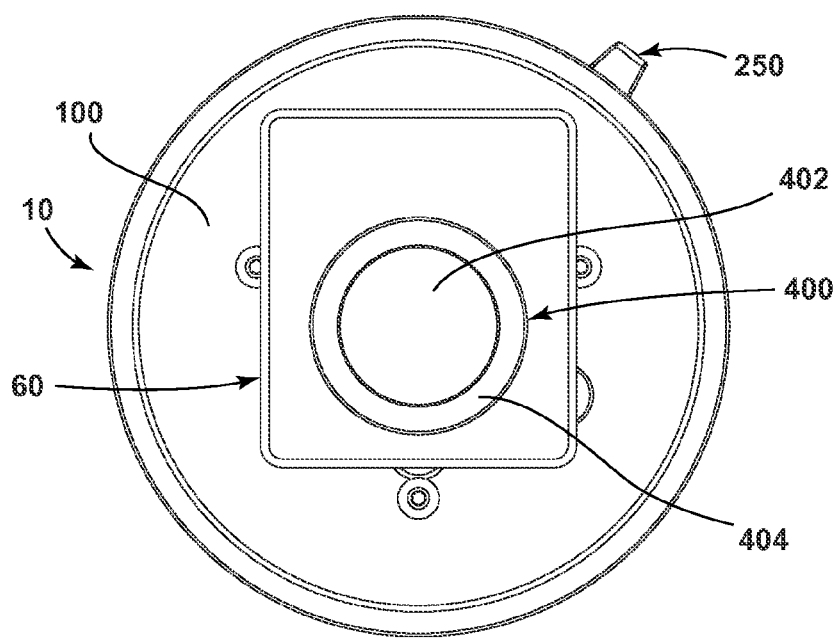
FIG. 27 is a rear elevational view of the multi-function appliance knob of FIG. 26.
Figure 28:
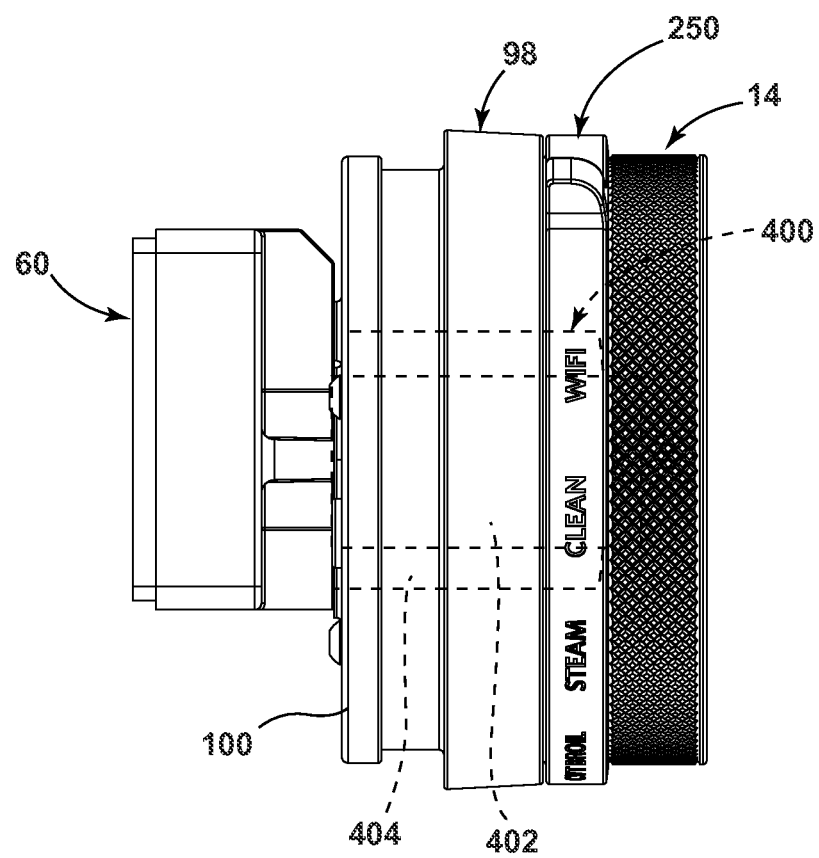
FIG. 28 is a side elevational view of the multi-function appliance knob of FIG. 26.

Referring now to the embodiments illustrated in FIGS. 26-28, it is contemplated that the control knob 10 can include a dual shaft transducer 400 that includes an inner ring 402 and an outer ring 404. It is contemplated that the inner ring 402 can be placed in communication with the outer control ring 14, where the inner ring 402 is directly engaged with the outer control ring 14. As such, the control knob 10 may not include the inner gearing mechanism 30 described above. Accordingly, there can be a 1:1 rotational relationship between the outer control ring 14 and the inner ring 402, such that no rotational modulation occurs as to the encoder shaft 28 as the outer control ring 14 is operated between the various rotational positions. Similarly, the outer ring 404 of the dual shaft transducer 400 can be placed in direct communication with the auxiliary control ring 250. The rotational relationship between the auxiliary control ring 250 and the outer ring 404 of the dual shaft transducer 400 in this embodiment can also be a 1:1 rotational relationship. As with the engagement between the outer control ring 14 and the inner ring 402 of the dual shaft transducer 400, the engagement between the auxiliary control ring 250 and the outer ring 404 of the dual shaft transducer 400 may not include a function gearing mechanism 282 such that no modulation of the rotational movement of the outer control ring 14 occurs to operate the function encoder 252.

Referring again to FIGS. 26-28, the various embodiments incorporating the dual shaft transducer 400 can work in conjunction with the rotation modulating mechanism 18 and/or the rotational reduction mechanism 330 to operate the indicial ring 24 at a different rotational rate than that of the outer control ring 14. In such an embodiment, it is contemplated that the various structural components of the control knob 10, such as the knob base 98 and the stationary hub 16, can extend around portions of the outer control knob 10 and the auxiliary control knob 10 to allow for the direct engagement between the outer control knob 10 and the inner ring 402 of the dual shaft transducer 400 as well as the auxiliary control ring 250 and the outer ring 404 of the dual shaft transducer 400.

Referring again to FIGS. 26-28, where the dual shaft transducer 400 includes one or more potentiometers, the rotation of the outer control ring 14 and the auxiliary control ring 250 can rotate the inner and outer rings 402, 404, respectively, of the dual shaft transducer 400, such that the rotation of the outer control ring 14 and the auxiliary control ring 250 operates one or more cams included within the various potentiometers. These cams that are operated by the outer control ring 14 and the auxiliary control ring 250 rotate within the potentiometer to provide the resistance output that operates the appliance control 60. Accordingly, due to the analog configuration of the potentiometers, the outer control ring 14 and the auxiliary control ring 250 of the control knob 10 may not be configured to not rotate 360°. Rather, according to various embodiments, the outer control ring 14 and auxiliary control ring 250 can include a rotational portion 410 through which the outer control ring 14 and auxiliary control ring 250 can rotate to operate the dual shaft transducer 400. A non-rotational portion 412 through which the outer control ring 14 and auxiliary control ring 250 cannot rotate can include rotational abutments 414 that prevent over rotation of the outer control ring 14 and the auxiliary control ring 250. It is contemplated that the rotational abutments 414 can be provided by the stationary hub 16 and/or the knob base 98 that provide the unitary structure of the control knob 10. As discussed above, this unitary structure contains the various operable components of the control knob 10 and also provides for the rotational movement within the rotational portion 410 to control the dual shaft transducer 400 and the appliance control 60 for setting the desired parameters selected by the user.

It will be understood by one having ordinary skill in the art that construction of the described device and other components is not limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. A control knob for an appliance, the control knob comprising:
    an outer control ring;
    a stationary hub;
    a rotation modulating mechanism coupled to the outer control ring and engaged with an outer surface of the stationary hub, wherein the outer control ring is rotationally operable about the stationary hub at a first rate;
    an indicial ring positioned around the stationary hub, wherein the indicial ring engages a portion of the rotation modulating mechanism, wherein rotation of the outer control ring at the first rate causes the rotation modulating mechanism to rotate the indicial ring about the stationary hub at a second rate, the second rate being different than the first rate; and
    an encoder shaft positioned within the stationary hub, wherein an inner gearing mechanism extends between an exterior surface of the encoder shaft and one of the outer control ring and the indicial ring.

2. The control knob of claim 1, wherein when the inner gearing mechanism extends between the encoder shaft and the outer control ring, the first rate is slower than the second rate, and wherein when the inner gearing mechanism extends between the encoder shaft and the indicial ring, and wherein the first rate is faster than the second rate.

3. The control knob of claim 2, wherein the inner gearing mechanism extends between the encoder shaft and the outer control ring, and wherein the rotation modulating mechanism includes planetary gears that rotationally engage outer cogs defined within the outer surface of the stationary hub and inner cogs defined within an inner surface of the indicial ring, and wherein the outer control ring includes planetary seats that hold the planetary gears in a fixed axial position relative to the outer control ring and allow the planetary gears to rotate within the planetary seats of the outer control ring.

4. The control knob of claim 3, wherein the outer control ring extends at least from the planetary gears to the inner gearing mechanism, wherein the inner gearing mechanism extends through a portion of the stationary hub to engage the outer control ring.

5. The control knob of claim 4, wherein the inner gearing mechanism includes a cluster gear having first and second gear portions, wherein the first gear portion engages the outer control ring, and wherein the second gear portion engages the encoder shaft to transfer the rotation of the outer control ring to the encoder shaft, and wherein the rotation of the outer control ring in a first rotational direction causes the encoder shaft to rotate in a second rotational direction that is opposite the first rotational direction.

6. The control knob of claim 5, wherein the inner gearing mechanism defines an inner reduction mechanism, wherein the first gear portion has a first diameter and the second gear portion has a second diameter, the first diameter being larger than the second diameter.

7. The control knob of claim 1, further comprising:
an auxiliary control ring positioned proximate the outer control ring, wherein the auxiliary control ring rotates independently of the outer control ring, and wherein the auxiliary control ring is in communication with a function encoder; and
an appliance control that includes a temperature control and a function control, wherein the temperature control is in communication with the encoder shaft and the function control is in communication with the function encoder.

8. A control knob for an appliance, the control knob comprising:
a rotation modulating mechanism having an external portion and an internal portion, wherein rotation of the external portion at a first angular distance causes the internal portion to rotate a second angular distance, the first angular distance being different than the second angular distance; and
an internal rotational mechanism having an encoder shaft and a transfer mechanism, wherein the encoder shaft is rotationally connected to an appliance control and the transfer mechanism, and wherein the transfer mechanism engages the internal portion of the rotation modulating mechanism to place a portion of the rotation modulating mechanism in communication with the appliance control, and wherein a rotation of the external portion in a first direction causes a rotation of the encoder shaft in a second direction that is opposite the first direction.

9. The control knob of claim 8, further comprising:
a stationary hub that is in a fixed position relative to the rotation modulating mechanism and the internal rotational mechanism, wherein the rotation modulating mechanism engages an outer surface of the stationary hub and rotates about the stationary hub, and wherein the internal rotational mechanism is disposed at least partially within an interior volume defined by the stationary hub.

10. The control knob of claim 9, wherein the stationary hub includes a perimetrical wall that defines the interior volume of the stationary hub, and wherein the transfer mechanism of the internal rotational mechanism extends through an aperture defined within the perimetrical wall to engage the external portion of the rotation modulating mechanism.

11. The control knob of claim 8, wherein the external portion of the rotation modulating mechanism includes planetary gears that extend between a stationary central sun gear and the internal portion of the rotation modulating mechanism, wherein the external portion includes planetary seats that hold the planetary gears in a fixed axial position relative to the external portion and allow the planetary gears to rotate within the planetary seats of the external portion, and wherein the external and internal portions of the rotation modulating mechanism rotate about the stationary central sun gear.

12. The control knob of claim 11, wherein the external portion of the rotation modulating mechanism extends from at least the planetary gears to the transfer mechanism of the internal rotational mechanism.

13. The control knob of claim 12, wherein the transfer mechanism includes a cluster gear having first and second gear portions, wherein the first gear portion engages the external portion of the rotation modulating mechanism and wherein the second gear portion engages the encoder shaft to transfer the rotation of the external portion to the encoder shaft.

14. The control knob of claim 13, wherein the first and second gear portions define an inner reduction mechanism, wherein the first gear portion has a first diameter and the second gear portion has a second diameter, the first diameter being larger than the second diameter.

15. The control knob of claim 8, further comprising:
an auxiliary control ring positioned proximate the external portion of the rotation modulating mechanism, wherein the auxiliary control ring rotates independently of the external portion, and wherein the auxiliary control ring is in communication with a function encoder that operates a function control of the appliance control, and wherein the encoder shaft operates a temperature control of the appliance control.

16. An appliance control knob comprising:
a stationary hub extending from a wall of an appliance, the stationary hub having an outer surface that defines a hub flange, wherein an appliance control is in communication with an interior volume of the stationary hub;
a rotation modulating mechanism in rotational engagement with the outer surface of the stationary hub;
an indicial ring that is positioned about the stationary hub and in rotational engagement with the rotation modulating mechanism, wherein rotation of the rotation modulating mechanism about the stationary hub at a first rate causes the indicial ring to rotate about the stationary hub at a second rate, the first rate being different than the second rate; and
an encoder shaft disposed within the interior volume of the stationary hub and a transfer mechanism that extends between the encoder shaft and the rotation modulating mechanism, wherein the encoder shaft and the transfer mechanism place the appliance control in communication with the rotation modulating mechanism, and wherein the hub flange positions the indicial ring at a predetermined distance from the wall of the appliance.

17. The appliance control knob of claim 16, further comprising:
an outer control ring that rotates about the stationary hub and is in communication with the rotation modulating mechanism, wherein the outer control ring rotates about the stationary hub at the first rate.

18. The appliance control knob of claim 17, wherein the rotation modulating mechanism includes planetary gears, wherein each of the planetary gears rotationally engages outer cogs defined within the outer surface of the stationary hub and inner cogs defined within an inner surface of the indicial ring, wherein the outer control ring includes planetary seats that hold the planetary gears in a fixed axial position relative to the outer control ring and allow the planetary gears to rotate within the planetary seats.

19. The appliance control knob of claim 18, wherein the first rate is slower than the second rate, and wherein the transfer mechanism extends through a portion of the stationary hub to engage the outer control ring.

20. The appliance control knob of claim 17, further comprising:
    an auxiliary control ring positioned proximate the outer control ring, wherein the auxiliary control ring rotates independently of the outer control ring, and wherein the auxiliary control ring is in communication with a function control.

* * * * *